(12) United States Patent
Suzuki et al.

(10) Patent No.: US 8,714,845 B2
(45) Date of Patent: *May 6, 2014

(54) DEVELOPER, PROCESS FOR TREATING DEVELOPING SOLUTION, PROCESS FOR PRODUCING PRINTING PLATE, AND FILTER APPARATUS

(71) Applicant: Asahi Kasei E-Materials Corporation, Tokyo (JP)

(72) Inventors: Kenji Suzuki, Tokyo (JP); Masafumi Shibano, Tokyo (JP)

(73) Assignee: Asahi Kasei E-Materials Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/865,334

(22) Filed: Apr. 18, 2013

(65) Prior Publication Data

US 2013/0230808 A1    Sep. 5, 2013

Related U.S. Application Data

(63) Continuation of application No. 13/365,659, filed as application No. PCT/JP2010/057297 on Apr. 23, 2010, now Pat. No. 8,444,333.

(30) Foreign Application Priority Data

Apr. 24, 2009 (JP) .................. 2009-107051
Apr. 23, 2010 (JP) .................. 2010-100379

(51) Int. Cl.
*G03D 5/00* (2006.01)

(52) U.S. Cl.
USPC ........................................ 396/611

(58) Field of Classification Search
USPC ........................................ 396/611
See application file for complete search history.

(56) References Cited

U.S. PATENT DOCUMENTS

| 5,759,743 | A | 6/1998 | Muramoto et al. |
| 6,247,856 | B1 | 6/2001 | Shibano et al. |
| 6,284,431 | B1 | 9/2001 | Tanizaki et al. |
| 6,855,487 | B2 | 2/2005 | Fiebag et al. |
| 7,208,263 | B2 | 4/2007 | Asato et al. |
| 8,444,333 | B2 * | 5/2013 | Suzuki et al. ............... 396/611 |
| 2003/0211419 | A1 | 11/2003 | Fan |
| 2010/0047718 | A1 | 2/2010 | Takeuchi et al. |

FOREIGN PATENT DOCUMENTS

| JP | 51-049803 | 4/1976 |
| JP | 54-068224 | 6/1979 |
| JP | 56-110941 | 9/1981 |
| JP | 07-171553 | 7/1995 |

(Continued)

OTHER PUBLICATIONS

European Office Action issued with respect to counterpart European Application No. 10767178.6, dated Oct. 22, 2012.

(Continued)

*Primary Examiner* — Rodney Fuller
(74) *Attorney, Agent, or Firm* — Greenblum & Bernstein, P.L.C.

(57) ABSTRACT

A process for producing a printing plate, includes feeding a developing solution to an exposed photosensitive resin composition layer; passing the developing solution, in which a photosensitive resin composition is dispersed, through a dispersed-material-filter and flocculating the photosensitive resin composition dispersed in the developing solution by the dispersed-object-filter, and removing a flocculated photosensitive resin composition from the developing solution passed through the dispersed-material-filter.

19 Claims, 19 Drawing Sheets

(56) References Cited

FOREIGN PATENT DOCUMENTS

| | | |
|---|---|---|
| JP | 07-333860 | 12/1995 |
| JP | 08-305030 | 11/1996 |
| JP | 09-258458 | 10/1997 |
| JP | 09-262589 | 10/1997 |
| JP | 11-153865 | 6/1999 |
| JP | 2001-321795 | 11/2001 |
| JP | 2001-327977 | 11/2001 |
| JP | 2002-096012 | 4/2002 |
| JP | 2004-077884 | 3/2004 |
| JP | 2005-004197 | 1/2005 |
| JP | 2008-277681 | 11/2008 |
| JP | 2009-080481 | 4/2009 |
| JP | 2010-054955 | 3/2010 |
| JP | 2010-054956 | 3/2010 |
| JP | 2010-054958 | 3/2010 |
| WO | 2008-056671 | 5/2008 |
| WO | 2008/075587 | 6/2008 |

OTHER PUBLICATIONS

Extended European Search report issued with respect to European Patent Application No. 10767178.6, dated Jun. 28, 2012.

* cited by examiner 112a-112i: Spacers 111a-111f: Rings
112a-112i: Spacers

DEVELOPER, PROCESS FOR TREATING DEVELOPING SOLUTION, PROCESS FOR PRODUCING PRINTING PLATE, AND FILTER APPARATUS

CROSS-REFERENCE TO RELATED APPLICATIONS

This application is a continuation of U.S. patent application Ser. No. 13/265,659, filed on Oct. 21, 2011, now U.S. Pat. No. 8,444,333, which is a National Stage of International Patent Application No. PCT/JP 2010/057297, filed on Oct. 23, 2010, which claims priority to Japanese Application Nos. JP 2010-100379, filed on Apr. 23, 2010 and JP 2009-107051, filed on Apr. 24, 2009, the disclosures of which are each expressly incorporated herein by reference in their entireties.

TECHNICAL FIELD

The present invention relates to a technique for treating a solution, and more specifically relates to a developer, a process for treating a developing solution, a process for producing a printing plate, and a filter apparatus.

BACKGROUND ART

When a printing plate composed of a photosensitive resin is produced, the photosensitive resin composition selectively exposed is developed by an aqueous developing solution, and the photosensitive resin composition of the non-exposed portion is dispersed or dissolved in the developing solution, for example. Here, when development of the photosensitive resin composition is repeated using the same developing solution, the concentration of the photosensitive resin composition dispersing in the developing solution is increased. As a result, reduction of development performance, adherence of a floating object to a brush and the like may occur. The non-cured photosensitive resin composition dispersing in the developing solution may adhere onto the surface of the printing plate again to deteriorate quality of the printing plate. For that reason, it is necessary to discard the developing solution having an increased concentration of the photosensitive resin composition and to resume platemaking using a fresh developing solution. Frequently repeated discarding of the used developing solution and replenishment of a fresh developing solution, however, are not preferred from the viewpoint of load to an environment and manufacturing cost. Then, Patent Literature 1 discloses a method for recovering a flocculate of a photosensitive resin composition floating in a developing solution by a filter.

PRIOR ART DOCUMENT

Patent Document

Patent Document 1: Japanese Patent Laid-Open No. 9-258458

SUMMARY OF INVENTION

Problem to be Solved by the Invention

In the case where a coarse filter is used in the method disclosed in Patent Literature 1, however, the photosensitive resin composition naturally flocculated in the developing solution can be recovered while the non-flocculated photosensitive resin composition dispersing in the developing solution passes through the filter and thus cannot be recovered. In the case where a fine filter is used in the method described in Patent Literature 1, the filter has to be frequently replaced.

Patent Literature 1 also discloses a method for adding a flocculant to a developing solution in off-line and recovering a flocculated photosensitive resin composition from the developing solution. However, the flocculant is expensive, and use of the flocculant is not preferred from the viewpoint of cost. Recovering of the developing solution from the developer and adding the flocculant in off-line also are not preferred from the viewpoint of manufacturing efficiency. Further, a problem of the developing solution to which the flocculant is added is that it cannot be reused directly at a developing step.

Then, one of objects of the present invention is to provide a developer that can efficiently remove photosensitive resin components dispersing in a developing solution, a process for treating a developing solution, a process for producing a printing plate, and a filter apparatus.

Means for Solving the Problem

A gist of an aspect according to the present invention is to be a developer comprising a feeder that feeds a developing solution to a photosensitive resin composition layer; a dispersing-object-filter, wherein the developing solution in which a photosensitive resin composition separated from the photosensitive resin composition layer is dispersed, is passed through the dispersing-object-filter to flocculate the photosensitive resin composition dispersing in the developing solution; and a flocculating-object-filter that removes a flocculated photosensitive resin composition from the developing solution passed through the dispersing-object-filter.

A gist of other aspect according to the present invention is to be a process for treating a developing solution, comprising the steps of: passing a developing solution in which a photosensitive resin composition is dispersed through a dispersing-object-filter and flocculating the photosensitive resin composition dispersing in the developing solution by the dispersing-object-filter; and removing a flocculated photosensitive resin composition from the developing solution passed through the dispersing-object-filter.

A gist of other aspect according to the present invention is to be a process for producing a printing plate, comprising the steps of: feeding a developing solution to an exposed photosensitive resin composition layer; passing a developing solution in which a photosensitive resin composition is dispersed through a dispersing-object-filter and flocculating the photosensitive resin composition dispersing in the developing solution by the dispersing-object-filter; and removing a flocculated photosensitive resin composition from the developing solution passed through the dispersing-object-filter.

A gist of further other aspect according to the present invention is to be a filter apparatus comprising: a dispersing-object-filter, wherein a solution in which resin composition is dispersed, is passed through the dispersing-object-filter to flocculate the resin composition dispersing in the solution; and a flocculating-object-filter that removes a flocculated resin composition from the solution passed through the dispersing-object-filter.

Advantageous Effects of the Invention

According to the present invention, it is possible to provide a developer, a process for treating a developing solution, a process for producing a printing plate, and a filter apparatus, that can efficiently remove photosensitive resin components dispersing in a developing solution.

EMBODIMENTS FOR CARRYING OUT THE INVENTION

Hereinafter, embodiments according to the present invention will be described using the drawings. However, the drawings are schematic. Accordingly, specific sizes or the like should be determined according to the following description. Needless to say, the drawings include portions having a different relationship and proportion of the size from each other.

First Embodiment

Figure 1:
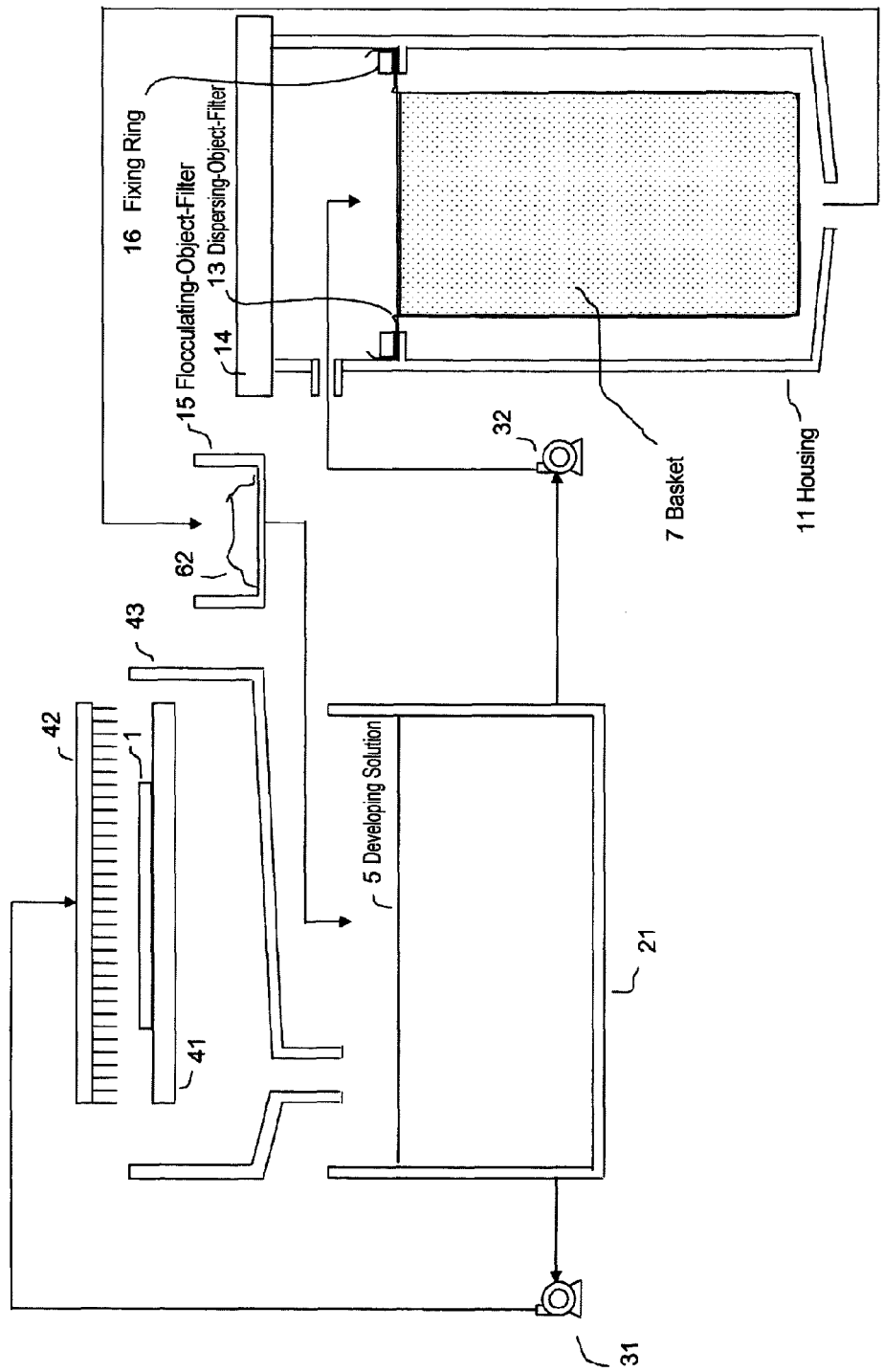
FIG. 1 is a schematic view showing a developer according to a first embodiment.

As shown in FIG. 1, a developer according to a first embodiment comprises a feeder 31 that feeds a developing solution 5 to a exposed printing raw plate 1; a dispersing-object-filter 13, the developing solution 5 in which photosensitive resin composition separated from the photosensitive resin composition layer of the exposed printing raw plate 1 is dispersed being passed through the dispersing-object-filter to flocculate the photosensitive resin composition dispersing in the developing solution 5; and a flocculating-object-filter 15 that removes a flocculated photosensitive resin composition from the developing solution 5 passed through the dispersing-object-filter 13. In FIG. 1, for convenience, the dispersing-object-filter 13 and a basket 7 that accommodates the dispersing-object-filter 13 are shown by a side view, and a housing 11 is shown by a sectional view.

The exposed printing raw plate 1 is disposed on a stage 41. A photosensitive resin composition is applied onto a support by a heat press molding method, a calendar process method, an extrusion molding method, or the like to form a photosensitive resin composition layer having a desired thickness in the exposed printing raw plate 1. The photosensitive resin composition is prepared by mixing a hydrophilic polymer, a photopolymerizable unsaturated monomer, a photopolymerization initiator, and the like by an extruder, a kneader, or the like. Materials having superior dimensional stability are preferably used for the support. Examples thereof include plastic members selected from a polyethylene terephthalate film, a polyethylene naphthalate film, a polybutylene terephthalate film, and polycarbonate, and metal members selected from steel, aluminum, copper, and nickel. From the viewpoint of mechanical properties, shape stability, handling properties at the time of platemaking of the printing plate, the thickness of the support is preferably from 50 to 350 µm, and more preferably from 100 to 250 µm. In order to improve adhesion between the support and the photosensitive resin composition layer, an adhesive layer may be provided when necessary.

The hydrophilic polymer included in the photosensitive resin composition refers to a polymer dissolved or swollen in water. Examples thereof include radical copolymers, polyamide polymers, polyvinyl alcohol polymers, polyester polymers, and urethane copolymers. The hydrophilic polymer may be used alone, or two or more thereof may be used in combination. The radical copolymer is obtained, for example, by copolymerization using not less than 1.0 part by mass of a hydrophilic unsaturated monomer in 100 parts by mass of unsaturated monomers. As the hydrophilic unsaturated monomer, acidic functional group comprising unsaturated monomers are preferred. Examples of the acidic functional group comprising unsaturated monomers include ethylenic unsaturated monomers having a carboxyl group, a sulfonic acid group, a phosphoric acid group, a boric acid group, or a hydroxyl group. The amount of the acidic functional group comprising unsaturated monomer to be used based on the whole amount of the unsaturated monomers is preferably from 1 to 30 wt %. At an amount of the acidic functional group comprising unsaturated monomer to be used of not less than 1 wt %, the exposed printing raw plate can be aqueously developed. At an amount of the acidic functional group comprising unsaturated monomer to be used of not more than 30 wt %, increase in the amount of moisture absorbed by the photosensitive resin composition and in the amount of the photosensitive resin composition swollen by an ink can be suppressed. Moreover, high workability at the time of mixing the photosensitive resin composition can be obtained.

Examples of the unsaturated monomer used for the radical copolymer include conjugated dienes, aromatic vinyl compounds, (meth)acrylic acid esters, ethylenic monocarboxylic acid alkyl ester monomers having a hydroxyl group, unsaturated dibasic acid alkyl esters, maleic anhydride, vinyl cyanide compounds, (meth)acrylamides and derivatives thereof, vinyl esters, vinyl ethers, vinyl halides, basic monomers having an amino group, vinylpyridines, olefins, silicon-containing α,β-ethylenically unsaturated monomers, and allyl compounds.

The unsaturated monomer may be used alone, or two or more thereof may be used in combination. Also, a monomer having two or more addition-polymerizable groups may be used. Emulsion polymerization is preferred although the method for polymerizing the radical copolymer used for the first embodiment is not particularly limited.

Preferably from 10 to 70 parts by mass and more preferably from 20 to 60 parts by mass of the hydrophilic polymer is used based on 100 parts by mass of the photosensitive resin composition. Use of from 10 to 70 parts by mass of the hydrophilic polymer based on 100 parts by mass of the photosensitive resin composition leads to good aqueous development properties and resistance against moisture absorption of the photosensitive resin composition layer.

Examples of the photopolymerizable unsaturated monomer included in the photosensitive resin composition include unsaturated carboxylic acids of acrylic acids and methacrylic acids ((meth)acrylic acids) or ester compounds thereof (for example, alkyl (meth)acrylates, cycloalkyl (meth)acrylates, haloalkyl (meth)acrylates, alkoxyalkyl (meth)acrylates, hydroxyalkyl (meth)acrylates, aminoalkyl (meth)acrylates, tetrahydrofurfuryl (meth)acrylates, allyl (meth)acrylates, glycidyl (meth)acrylates, benzyl (meth)acrylates, phenoxy (meth)acrylates; mono- or di-(meth)acrylates of alkylene glycol or polyoxyalkylene glycol; trimethylolpropane tri(meth)acrylates; and pentaerythritol tetra(meth)acrylates); (meth)acrylamides or derivatives thereof (for example, (meth)acrylamides N-substituted or N,N'-substituted with an alkyl group or a hydroxyalkyl group; diacetone (meth)acrylamides; and N,N'-alkylene bis(meth)acrylamides); allyl compounds (for example, allyl alcohol, allyl isocyanate, diallyl phthalate, and triallylcyanurate); maleic acid, maleic anhydride, fumaric acid, or esters thereof (for example, mono- or di-alkyl maleate, mono- or di-alkyl fumarate, mono- or di-haloalkyl maleate, mono- or di-haloalkyl fumarate, mono- or di-alkoxyalkyl maleate, mono- or di-alkoxyalkyl fumarate); and other unsaturated compounds (for example, styrene, vinyltoluene, divinylbenzene, N-vinylcarbazole, and N-vinylpyrrolidone).

The photopolymerizable unsaturated monomer may be used alone, or two or more thereof may be used in combination. Preferably, 1 to 30 parts by mass of the photopolymerizable unsaturated monomer is used based on 100 parts by mass of the photosensitive resin composition. Use of not less than 1 part by mass of the photopolymerizable unsaturated monomer based on 100 parts by mass of the photosensitive resin composition leads to superior forming properties of details and characters of a printing plate such as a flexographic printing plate formed using the photosensitive resin composition. Use of not more than 30 parts by mass of the photopolymerizable unsaturated monomer based on 100 parts by mass of the photosensitive resin composition can suppress deformation during storing or transporting the printing raw plate before the photosensitive resin composition layer is cured. Moreover, the printing plate formed using the photosensitive resin composition can have proper hardness, and a solid portion has good ink deposition even in printing to a printed medium of low paper quality having unevenness on the surface thereof.

Examples of the photopolymerization initiator included in the photosensitive resin composition include thioxanthones such as benzophenone, 4,4-bis(diethylamino)benzophenone, t-butylanthraquinone, 2-ethylanthraquinone, 2,4-diethylthioxanthone, isopropylthioxanthone, and 2,4-dichlorothioxanthone; acetophenones such as diethoxyacetophenone, 2-hydroxy-2-methyl-1-phenylpropan-1-one, benzyldimethylketal, 1-hydroxycyclohexyl phenyl ketone, 2-methyl-2-morpholino(4-thiomethylphenyl)propan-1-one, and 2-benzyl-2-dimethylamino-1-(4-morpholinophenyl)-butanone; benzoin ethers such as benzoin methyl ether, benzoin ethyl ether, benzoin isopropyl ether, and benzoin isobutyl ether; acyl phosphine oxides such as 2,4,6-trimethylbenzoyldiphenylphosphine oxide, bis(2,6-dimethoxybenzoyl)-2,4,4-trimethylpentylphosphine oxide, and bis(2,4,6-trimethylbenzoyl) phenylphosphine oxide; methylbenzoylformate; 1,7-bisacridinylheptane; and 9-phenylacridine.

The photopolymerization initiator may be used alone, or two or more thereof may be used in combination. Preferably, from 0.1 to 10 parts by mass of the photopolymerization initiator is used based on 100 parts by mass of the photosensitive resin composition. Use of not less than 0.1 parts by mass of the photopolymerization initiator based on 100 parts by mass of the photosensitive resin composition leads to superior forming properties of details and characters of a printing plate formed using the photosensitive resin composition. Use of not more than 10 parts by mass of the photopolymerization initiator based on 100 parts by mass of the photosensitive resin composition can suppress reduction in transmittance of active light such as ultraviolet rays, and thereby exposure can be performed under proper exposure sensitivity.

The photosensitive resin composition may comprise a thermoplastic elastomer when necessary. The thermoplastic elastomer refers to elastomers that exhibit rubber elasticity in the vicinity of normal temperature, hardly deform plastically, and are plasticized with heat when the composition is mixed by an extruder or the like. Examples of the thermoplastic elastomer include thermoplastic block copolymers, 1,2-polybutadiene, polyurethane elastomers, and chlorinated polyethylenes. The thermoplastic elastomer may be used alone, or two or more thereof may be used in combination. As the thermoplastic elastomer, the thermoplastic block copolymers are preferred, and polymers obtained by polymerizing a monovinyl-substituted aromatic hydrocarbon monomer and a conjugated diene monomer are more preferred.

Examples of the monovinyl-substituted aromatic hydrocarbon monomer include styrene, α-methylstyrene, p-methylstyrene, and p-methoxystyrene. Examples of the conjugated diene monomer include butadiene and isoprene. By polymerization of these monomers, a styrene-butadiene-styrene block copolymer and a styrene-isoprene-styrene block copolymer, for example, are obtained.

The content of the monovinyl-substituted aromatic hydrocarbon segment in the thermoplastic elastomer is preferably from 8 to 50 wt %. At a content of not less than 8 wt %, occurrence of a cold flow of the photosensitive resin composition can be suppressed, and superior thickness accuracy is obtained. At a content of not more than 50 wt %, the printing plate formed using the photosensitive resin composition can have proper hardness, and has superior printing quality. Although vinyl-bond units in the conjugated diene segments of the thermoplastic elastomer contribute to improvement in reproducibility of a relief, they also cause increase in adhesiveness of the surface of the printing plate simultaneously. From the viewpoint of balancing both of these properties, the average percentage of vinyl segments is preferably from 5 to 40%, and more preferably from 10 to 35%. The average percentage of vinyl segments refers to the proportion of vinyl-bond units based on the whole amount of double bonds other than the aromatic ring in the thermoplastic elastomer.

Preferably from 5 to 50 parts by mass and more preferably from 10 to 40 parts by mass of the thermoplastic elastomer is used based on 100 parts by mass of the photosensitive resin composition when desired. Use of from 5 to 50 parts by mass of the thermoplastic elastomer based on 100 parts by mass of the photosensitive resin composition leads to good properties in a elongation ratio, water resistance and swelling resistance against ink of the printing plate.

The photosensitive resin composition may comprise various auxiliary additives such as a plasticizer, a thermal polymerization inhibitor, an ultraviolet absorbing agent, an antihalation agent, and a light stabilizer, for example.

Examples of the plasticizer include hydrocarbon oils having fluidity at normal temperature such as liquid naphthene oil and paraffin oil, liquid polybutadiene, liquid polyisoprene, modified products of liquid polybutadiene, liquid acrylonitrile-butadiene copolymers, liquid styrene-butadiene copolymers, and polystyrenes having a number average molecular weight of not more than 2,000, sebacic acid esters, and phthalic esters. As the plasticizer, a photopolymerizable reactive group may be attached to these structures. The plasticizer may be used alone, or two or more thereof may be used in combination.

Examples of the thermal polymerization inhibitor include amide and hydrazide heavy metal deactivators, quenchers such as organic Ni quenchers, hindered piperidine HALS, phenol antioxidants such as hindered phenol antioxidants and semi-hindered phenol antioxidants, phosphorus antioxidants such as phosphite antioxidants and phosphonate antioxidants, thioether antioxidants, and sulfur antioxidants. The thermal polymerization inhibitor may be used alone, or two or more thereof may be used in combination.

Examples of the ultraviolet absorbing agent include benzophenone ultraviolet absorbing agents, triazine ultraviolet absorbing agents, and benzotriazole ultraviolet absorbing agents. The ultraviolet absorbing agent may be used alone, or two or more thereof may be used in combination.

The exposed printing raw plate 1 shown in FIG. 1 may further include an infrared ablation layer disposed on the photosensitive resin composition layer comprising the photosensitive resin composition. The infrared ablation layer is composed of a binder polymer, an infrared absorbing substance, and a non-infrared shielding substance, and is used as a mask layer at the time of exposure.

Examples of the binder polymer include styrene described in Japanese Patent Laid-Open No. 11-153865, copolymers composed of a monovinyl-substituted aromatic hydrocarbon such as styrene, α-methylstyrene, and vinyltoluene and a conjugated diene such as butadiene and isoprene, those prepared by hydrogenating copolymers composed of a monovinyl-substituted aromatic hydrocarbon and a conjugated diene, polyamide described in Japanese Patent Laid-Open No. 8-305030, polyvinyl alcohol, graft copolymers of polyvinyl alcohol/polyethylene glycol, amphoteric interpolymers, alkyl celluloses, hydroxyalkyl celluloses, nitrocelluloses, copolymers of ethylene and vinyl acetate, cellulose acetate butyrate, polybutyral, cyclic rubbers, copolymers of styrene and acrylic acid, and copolymers of polyvinyl pyrrolidone and vinyl acetate. The binder polymer may be used alone, or two or more thereof may be used in combination.

Examples of the infrared absorbing substance include substances usually having a strong absorption wavelength at 750 to 2000 nm, and examples thereof include inorganic pigments such as carbon black, graphite, copper chromite, and chrome oxide, and pigments such as poly phthalocyanine compounds, cyanine dyes, and metal thiolate pigments. Among them, carbon black can be used in the wide range of a particle size of from 13 to 85 nm. The infrared absorbing substance is added to the infrared ablation layer in the range in which the infrared ablation layer is given sensitivity at which cutting off by a laser beam to be used is enabled. The amount of the infrared absorbing substance to be added is usually from 10 to 80 wt % based on the whole amount of the components of the infrared ablation layer. The infrared absorbing substance may be used alone, or two or thereof may be used in combination.

Examples of the non-infrared shielding substance include substances that reflect or absorb ultraviolet light, and examples thereof include an ultraviolet absorbing agent, carbon black, and graphite. The non-infrared shielding substance is added to the infrared ablation layer in the range at which a desired optical density can be achieved. The amount of the non-infrared shielding substance to be added based on the whole amount of the components of the infrared ablation layer is an amount such that a optical density may be usually not less than 2.0, and preferably not less than 3.0. The non-infrared shielding substance may be used alone, or two or more thereof may be used in combination.

The infrared absorbing substance and the non-infrared shielding substance may be the same substance.

Instead of the printing raw plate comprising the infrared ablation layer, a printing raw plate comprising a protective layer on the surface of the photosensitive resin composition layer may be used. In the case where the printing raw plate has the protective layer, a printing plate can be obtained by closely contacting an image carrier such as a negative film with the surface of the protective layer, and performing exposure and development. Examples of the protective layer include films that can be removed at a developing step, and examples thereof include a water-soluble cellulose coated film layer and a polyvinyl alcohol coated film layer. The printing raw plates comprising the protective layers described in Japanese Patent Laid-Open Nos. 51-49803, 54-68224, and 56-110941 can be used.

Before the exposed printing raw plate 1 is conveyed onto the stage 41 shown in FIG. 1, the photosensitive resin composition layer of the exposed printing raw plate 1 is selectively exposed using active rays and a mask to be photo-cured. Examples of the light source for the active rays include a low pressure mercury lamp, a high pressure mercury lamp, an ultraviolet fluorescence light, a carbon arc lamp, a xenon lamp, a zirconium lamp, and sunlight. Examples of the mask include a negative film and the infrared ablation layer ablated by an infrared laser.

The developing solution 5 that develops the photosensitive resin composition layer of the exposed printing raw plate 1 disposed on the stage 41 comprises a surface active agent, and comprises a washing accelerator and/or a pH adjuster when desired. Usually, the surface active agent is a substance showing an action of dissolving in water to reduce the surface tension of water. Examples of the surface active agent include nonionic, anionic, cationic, and amphoteric surface active agents. The surface active agent may be used alone, or two or thereof may be used in combination. The concentration of the surface active agent in the developing solution 5 is from 0.5 to 10 wt %, for example.

Examples of the nonionic surface active agent include higher alcohol alkylene oxide adducts, alkylphenol alkylene oxide adducts, fatty acid alkylene oxide adducts, polyhydric alcohol fatty acid ester alkylene oxide adducts, higher alkylamine alkylene oxide adducts, fatty acid amide alkylene oxide adducts, alkylene oxide adducts of fats and oils, and polypropylene glycol alkylene oxide adducts as polyethylene-glycol type, fatty acid esters of glycerol, fatty acid esters of pentaerythritol, fatty acid esters of sorbitol and sorbitan, and fatty acid esters of sucrose as polyhydric alcohol type, alkyl ethers of polyhydric alcohols, and fatty acid amides of alkanolamines.

Examples of the anionic surface active agent include linear alkylbenzene sulfonic acid salts having an alkyl group with the number of carbons of 8 to 16 on average, α-olefin sulfonic acid salts having the number of carbons of 10 to 20 on average, dialkyl sulfosuccinic acid salts having an alkyl group or alkenyl group with the number of carbons of 4 to 10, sulfonic acid salts of fatty acid lower alkyl esters, alkyl sulfuric acid salts having the number of carbons of 10 to 20 on average, alkyl ether sulfuric acid salts that have a linear or branched alkyl group or alkenyl group having the number of carbons of 10 to 20 on average and to which 0.5 to 8 mol of ethylene oxide on average is added, and saturated or unsaturated fatty acid salts having the number of carbons of 10 to 22 on average.

Examples of the cationic surface active agent include alkylamine salts, alkylamine ethylene oxide adducts, alkyltrimethylammonium salts, alkyldimethylbenzylammonium salts, Sapamine-type quarternary ammonium salts, and pyridium salts.

Examples of the amphoteric surface active agent include lauryl aminopropionic acid sodium and lauryldimethyl betaine.

Examples of the washing accelerator included in the developing solution 5 include amines such as monoethanolamine, diethanolamine, and triethanolamine; glycol ethers; ammonium salts such as tetramethylammonium hydroxide; and organic solvents such as paraffin hydrocarbons.

Examples of the pH adjuster included in the developing solution 5 include sodium borate, sodium carbonate, sodium silicate, sodium metasilicate, sodium succinate, and sodium acetate.

As shown in FIG. 1, the developing solution 5 is temporarily stored in a developing solution tank 21. The feeder 31 such as a pump is connected to the developing solution tank 21. The developing solution 5 in the developing solution tank 21 is continuously fed to the exposed printing raw plate 1 through the feeder 31. The exposed printing raw plate 1 may be immersed in the developing solution 5, or the developing solution 5 may be sprayed from a spray nozzle or the like to the exposed printing raw plate 1. When the developing solution 5 is fed, the photosensitive resin composition in an unexposed portion of the photosensitive resin composition layer of the exposed printing raw plate 1 reacts with the developing solution 5 to disperse or dissolve in the developing solution 5. The photosensitive resin composition in the unexposed portion is scraped off from the exposed printing raw plate 1 using a brush 42. The photosensitive resin composition dispersing in the developing solution 5 is covered with the surface active agent included in the developing solution 5. For this reason, the photosensitive resin composition dispersed in the developing solution 5 tends to be kept dispersed without being flocculated in the developing solution 5. Each size of the dispersing photosensitive resin composition is 10 to 70 μm, for example. Part of the dispersing photosensitive resin composition may be flocculated in the developing solution 5 to float on the surface of the solution in the developing solution tank.

The photosensitive resin composition flocculated in the developing solution tank comprises the hydrophilic polymer as a principal component, and comprises the thermoplastic elastomer, the plasticizer, and the infrared ablation layer component depending on the printing raw plate to be used. The photopolymerizable unsaturated monomer and the photopolymerization initiator dissolve in the developing solution, and therefore do not flocculate alone. The same goes for the photosensitive resin composition flocculated by the dispersing-object-filter, which will be described later.

Figure 2:
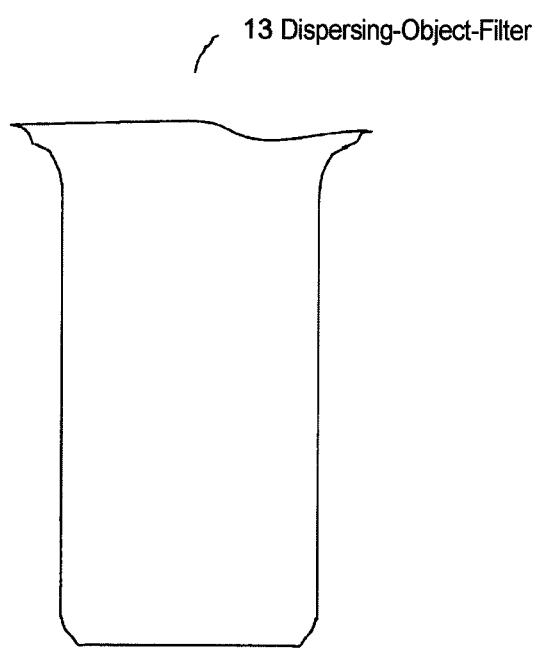
FIG. 2 is a side view showing a dispersing-object-filter according to the first embodiment.

The developing solution 5 comprising the dispersing photosensitive resin composition is again returned to the developing solution tank 21 through a developing tank 43. A feeder 32 such as a pump is further connected to the developing solution tank 21. At least part of the developing solution 5 stored in the developing solution tank 21 and comprising the dispersing photosensitive resin composition is sent into the cylindrical portion of the cylindrical dispersing-object-filter 13 through the feeder 32. As shown in FIG. 2, which is a side view, the dispersing-object-filter 13 is a bag-like bag filter, for example, and comprises a polymer such as polyester, viscose, polypropylene, nylon, Nomex, wool yarn, or fluororesin. In the case where the dispersing-object-filter 13 comprises a polymer, the diameter of each fiber is 50 μm, for example. As shown in FIG. 1, the dispersing-object-filter 13 is accommodated in the mesh basket 7 having an approximately cylindrical shape, and the basket 7 is stored in the cylindrical housing 11. The dispersing-object-filter 13 is fixed to the inside of the housing 11 by a fixing ring 16. The housing 11 is made of metal such as aluminum and stainless steel, for example.

Figure 3:
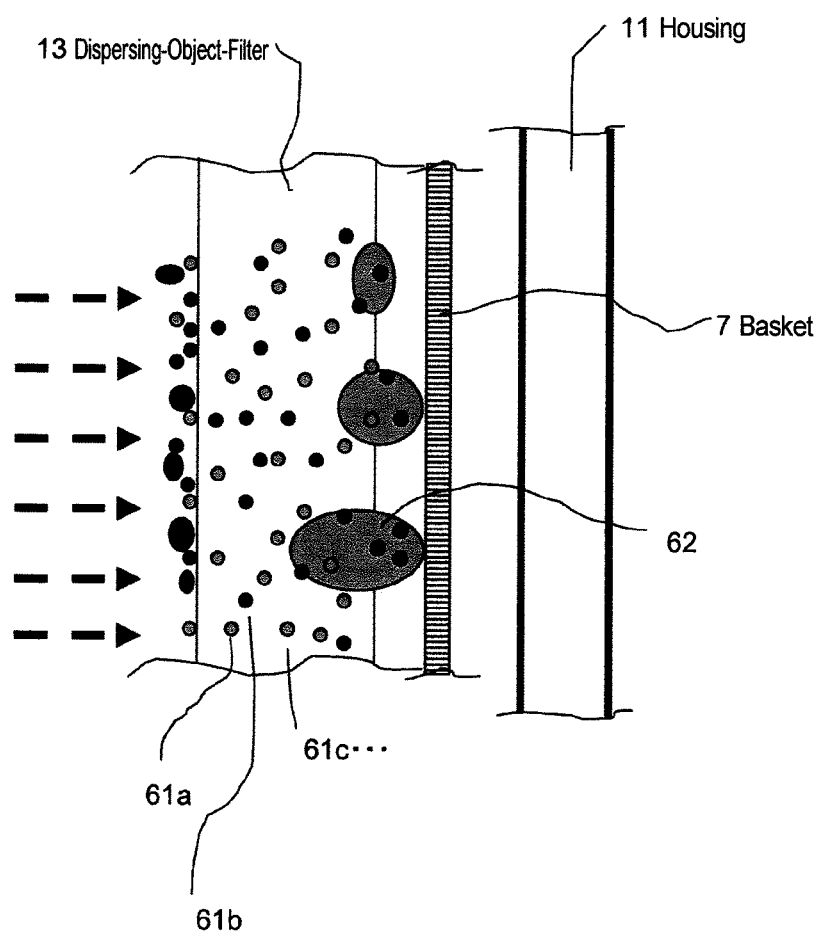
FIG. 3 is a schematic view showing a flocculation process of a photosensitive resin composition dispersing in a developing solution according to the first embodiment.

When the developing solution 5 comprising the dispersing photosensitive resin composition passes from the inside to the outside of the bag-like dispersing-object-filter 13, for example, photosensitive resin compositions 61a, 61b, and 61c . . . are accumulated in the inside of the film of the dispersing-object-filter 13 as shown in FIG. 3. The photosensitive resin compositions 61a, 61b, and 61c . . . accumulated in the inside of the film are rubbed against the dispersing-object-filter 13, for example, and thereby the surface active agent that covers the surfaces of the photosensitive resin composition is removed. The photosensitive resin compositions 61a, 61b, and 61c . . . flocculate each other without adding a flocculant to form flocculates 62. The flocculates 62 are pushed out to the outside from the inside of the film of the dispersing-object-filter 13 by pressure such as hydraulic pressure, and deposited between the outside of the dispersing-object-filter 13 and the inside of the basket 7. The flocculated photosensitive resin composition flocculated in the developing solution tank 21 may also be pushed out to the outside of the filter. The developing solution 5 comprising the dispersing photosensitive resin composition may be passed from the outside to the inside of the bag-like dispersing-object-filter 13.

In the case where the exposed printing raw plate comprising the infrared ablation layer is developed, the developing solution 5 may comprise the components of the infrared ablation layer peeled off during development. In the case where the developing solution 5 comprises the components of the infrared ablation layer, the components of the infrared ablation layer are incorporated into the flocculates 62 formed in the dispersing-object-filter 13. The dispersing-object-filter 13 can flocculate the photosensitive resin composition dispersing in the developing solution 5 and catch the components of the infrared ablation layer simultaneously and suitably. The same goes for the case where the components of the infrared ablation layer included in the developing solution 5 are already included in the developing solution before the exposed printing raw plate 1 shown in FIG. 1 is developed.

$P_1$ is the pressure in the space of the surface side of the dispersing-object-filter 13 facing upstream of the flow of the developing solution 5 shown in FIG. 1, namely, the pressure in the space of the feed side of the dispersing-object-filter 13, specifically, the pressure in the space of the internal surface side of the bag-like dispersing-object-filter 13. $P_2$ is the pressure in the space of the surface side of the dispersing-object-filter 13 facing downstream of the flow of the developing solution 5, namely, the pressure in the space of the discharge side of the dispersing-object-filter 13, specifically, the pressure in the space of the external surface side of the bag-like dispersing-object-filter 13. In this case, it is preferred that the pressure in the space of the feed side of the dispersing-object-filter 13 be increased, and/or that in the space of the discharge side of the dispersing-object-filter 13 be reduced. Specifically, the relationship between the pressure $P_1$ and the pressure $P_2$ is preferably $0.02 \text{ MPa} \leq P_1-P_2 \leq 2 \text{ MPa}$, more preferably $0.04 \text{ MPa} \leq P_1-P_2 \leq 1 \text{ MPa}$, and still more preferably $0.06 \text{ MPa} \leq P_1-P_2 \leq 0.5 \text{ MPa}$. If the difference between the pressure $P_1$ and the pressure $P_2$ is not less than 0.02 MPa, flocculation of the photosensitive resin compositions 61a, 61b, and 61c . . . shown in FIG. 3 is facilitated. If the difference between the pressure $P_1$ and the pressure $P_2$ is not more than 2 MPa, load on the dispersing-object-filter 13 and other components in the developer can be reduced.

The case where the pressure $P_1$ is the pressure in the space of the internal surface side of the dispersing-object-filter 13 and the pressure $P_2$ is the pressure in the space of the external surface side of the dispersing-object-filter 13 will be exemplified and described. The difference between the pressure $P_1$ and the pressure $P_2$ can be set by increasing the pressure $P_1$ in the space of the internal surface side of the dispersing-object-filter 13 by the feeder 32 such as a pump shown in FIG. 1, in the case where $P_2$ is an atmospheric pressure, for example. Air pressure may be applied to the internal surface of the bag-like dispersing-object-filter 13. In the case where the pressure $P_1$ in the space of the internal surface side of the dispersing-object-filter 13 is increased, the space of the internal surface side of the dispersing-object-filter 13 is preferably substantially a closed space if it is thought that the dispersing-object-filter 13 is also an outer wall. The pressure in the space of the outer side surface of the bag-like dispersing-object-filter 13 may be reduced by a pump, an aspirator, or the like. In the case where the pressure $P_2$ in the space of the external surface side of the dispersing-object-filter 13 is reduced, the space of the external surface side of the dispersing-object-filter 13 is preferably substantially a closed space if it is thought that the dispersing-object-filter 13 is also an outer wall. Increase in the pressure $P_1$ and reduction in the pressure $P_2$ may be used in combination. The pressure $P_1$ may be the pressure in the space of the external surface side of the dispersing-object-filter 13, or the pressure $P_2$ may be the pressure in the space of the internal surface side of the dispersing-object-filter 13.

From the viewpoint of flocculation efficiency, the thickness of the dispersing-object-filter 13 is preferably not less than 0.01 mm and not more than 10 mm, and more preferably not less than 0.5 mm and not more than 5 mm. At a thickness of not less than 0.01 mm, the flocculation efficiency of the dispersing photosensitive resin composition is increased. At a thickness of not more than 10 mm, the pressure applied to the dispersing-object-filter 13 can be adjusted to a proper pressure. The thickness of the dispersing-object-filter can be measured as follows: a thickness meter ID-F125 made by Mitutoyo Corporation is attached to a BIEFFEBI Spessimetor 2, and set such that the a load of 1.0 kg may be applied to a contact surface having a diameter of 1 cm.

In the case where the dispersing-object-filter 13 is made of the above polymer, and suitably is made of synthetic polymer resin, the density of the dispersing-object-filter 13 is preferably not less than 0.05 g/cm$^3$ and not more than 1 g/cm$^3$, and more preferably not less than 0.07 g/cm$^3$ and not more than 0.5 g/cm$^3$. At a density of not less than 0.05 g/cm$^3$, the flocculation efficiency of the dispersing photosensitive resin composition tends to be increased. At a density of not more than 1 g/cm$^3$, the pressure applied to the dispersing-object-filter 13 can be adjusted to a proper pressure. The density can be calculated by cutting the dispersing-object-filter 13 into 10 cm×10 cm, and weighing the weight. In the case where the dispersing-object-filter 13 is made of metal, a filter having one type of opening may be used, or several layers of filters having the same or different openings may be disposed.

For example, if the dispersing photosensitive resin composition is preferably not less than 0.16 parts by mass and not more than 6 parts by mass and more preferably not less than 0.6 parts by mass and not more than 3 parts by mass based on 100 parts by mass of the developing solution, the dispersing photosensitive resin composition is suitably flocculated by the dispersing-object-filter 13.

As shown in FIG. 1, the developing solution 5 passed through the dispersing-object-filter 13 is fed to the flocculating-object-filter 15. The developing solution 5 passed through the dispersing-object-filter 13 may comprise the flocculates flocculated by the dispersing-object-filter 13. The flocculating-object-filter 15 catches the flocculates 62 included in the developing solution 5. The shape and material of the flocculating-object-filter 15 is not particularly limited as long as the flocculating-object-filter can catch the flocculates 62 included in the developing solution 5. The flocculating-object-filter 15 that catches the flocculates 62 needs to be replaced by another flocculating-object-filter 15 when the amount of the caught flocculates 62 approaches the capacity of the flocculating-object-filter 15. For this reason, a shape and material enabling periodic replacement and taking out of the filter are preferably used. Examples of the flocculating-object-filter 15 include nets produced from nylon, polyethylene, polypropylene, polyester, and polyethylene terephthalate (PET), a stainless steel mesh filter having an opening of 0.3 mm, fabrics, and nonwoven fabrics.

The developing solution 5 passed through the flocculating-object-filter 15 is returned to the developing solution tank 21 again. According to the developer according to the first embodiment, the photosensitive resin composition dispersing in the developing solution 5 can be flocculated by the dispersing-object-filter 13, and the flocculates can be removed from the developing solution 5 efficiently by the flocculating-object-filter 15. The photosensitive resin composition is flocculated by the dispersing-object-filter 13 without using a flocculant that weakens the action of the surface active agent. For this reason, the developing solution 5 passed through the flocculating-object-filter 15 can be used for development of the photosensitive resin composition layer again.

The technique for reusing a developing solution is known. In the related art, however, if a fine filter that can catch the photosensitive resin composition dispersing in the developing solution is used, clogging is caused in a short time and frequent replacement of the filter is required. On the other hand, if the developing solution filtered by a coarse filter is reused, the photosensitive resin composition dispersing in the developing solution adheres to the surface of the exposed printing raw plate and flocculates thereon, leading to deterioration of quality of the printing plate produced. A process for flocculating dispersing resin components by using a flocculant is also known. If the developing solution to which the flocculant is added is reused, the photosensitive resin composition in the unexposed portion of the photosensitive resin composition layer is flocculated by a flocculant immediately after the photosensitive resin composition is dispersed in the developing solution, and adheres to the photosensitive resin composition layer. This also leads to deterioration of quality of the printing plate produced. In other related art, pH or a temperature is controlled to weaken the surface active agent, and thereby the photosensitive resin composition dispersing in the developing solution is flocculated. This operation is complicated, however.

In contrast to this, according to the developer according to the first embodiment, the photosensitive resin composition dispersing in the developing solution 5 can be removed effectively without a flocculant even by use of a fine filter. Control of pH, a temperature, or the like is also unnecessary. For that reason, the photosensitive resin composition dispersing in the developing solution 5 can be simply removed at low cost in a short time. Accordingly, quality of the printing plate produced can be improved at low cost. In the developer according to the first embodiment, addition of the flocculant to the developing solution 5 may cause clogging in the dispersing-object-filter 13. Rather, it is preferred that no flocculant be used.

Flocculates naturally produced and floated on the surface of the developing solution 5 in the developing solution tank 21 and those sedimented at the bottom of the developing solution tank 21 may be selectively sucked and fed to the dispersing-object-filter 13 to be removed. The flocculates flocculated in the developing solution tank 21 are selectively sucked, and fed to the dispersing-object-filter 13, and thereby the flocculates can be recovered before the flocculates excessively grow. As a result, the frequency that a worker cleans the developing solution tank 21 can be reduced. In the case where the flocculates tend to float on the surface of the developing solution 5 in the developing solution tank 21, it is preferred from the viewpoint of growth of the flocculates that the developing solution 5 be sucked in the vicinity of the upper portion of the developing solution tank 21, and fed to the dispersing-object-filter 13. In the case where the flocculates tend to precipitate on the bottom in the developing solution tank 21, the developing solution 5 is preferably sucked in the vicinity of the bottom of the developing solution tank 21, and fed to the dispersing-object-filter 13.

Second Embodiment

Figure 4:
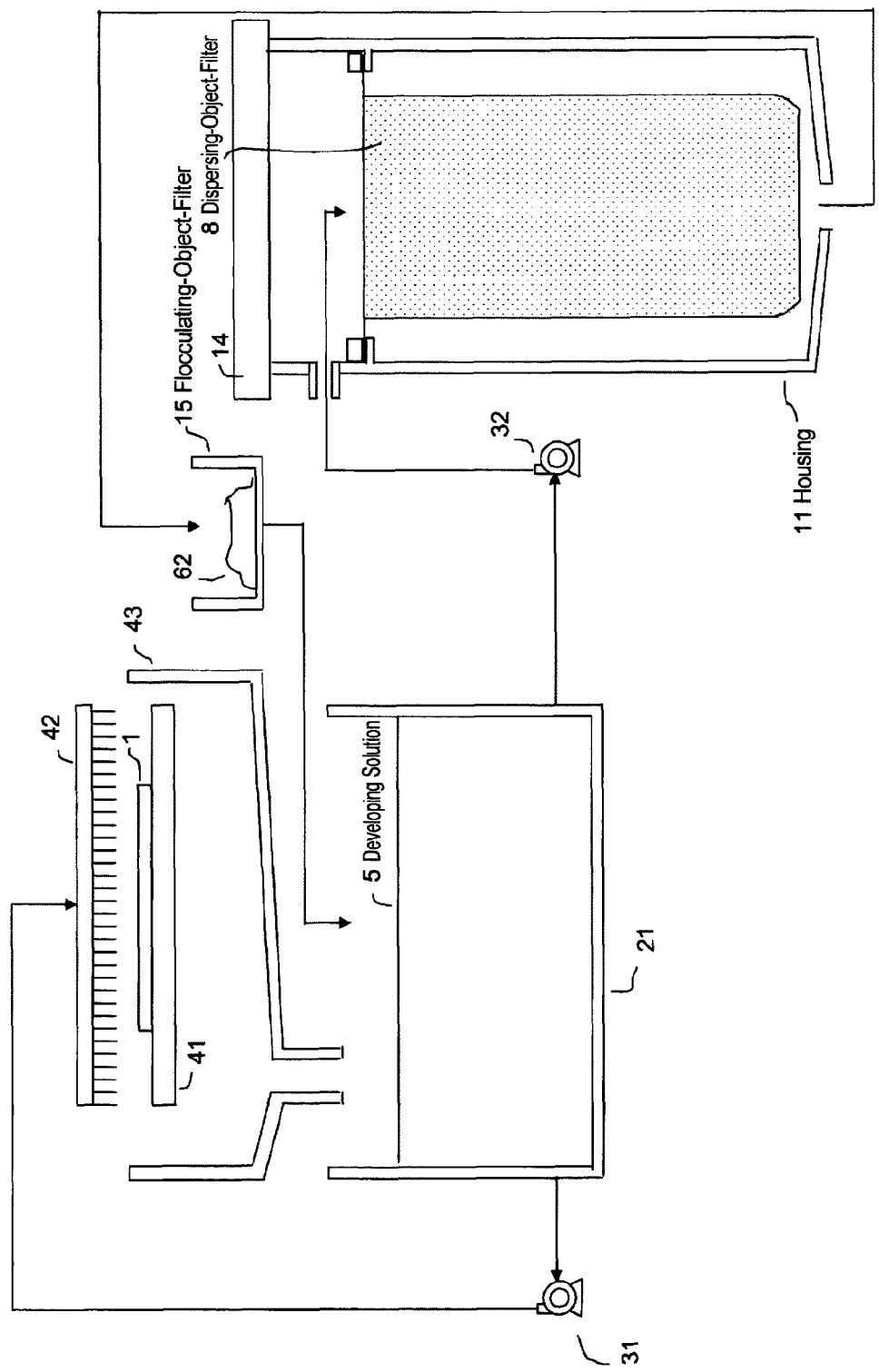
FIG. 4 is a schematic view showing a developer according to a second embodiment.

In the first embodiment, an example is shown in which the dispersing-object-filter 13 shown in FIG. 1 is a bag filter, and comprises a polymer. In contrast to this, in the developer according to a second embodiment shown in FIG. 4, a bag-like dispersing-object-filter 8 is a mesh filter made of metal such as aluminum and stainless steel and provided with a mesh with an opening of 10 μm, for example. In the case where the dispersing-object-filter 8 is a filter made of metal, the basket that accommodates the dispersing-object-filter 8 may be eliminated. Other components of the developer according to the second embodiment are the same as those of the first embodiment. In FIG. 4, for convenience, the dispersing-object-filter 8 is shown by a side view, and the housing 11 is shown by a sectional view. Also in the developer according to the second embodiment, the photosensitive resin composition dispersing in the developing solution 5 can be flocculated effectively by the dispersing-object-filter 8.

Third Embodiment

Other aspect according to the present invention also provides a basket for a filter comprising a plurality of rings disposed in parallel; and a plurality of strip-like spacers that connect inner circumferences of the plurality of rings to each other, at least part of a cylindrical filter being accommodated within the plurality of spacers.

Figure 5:
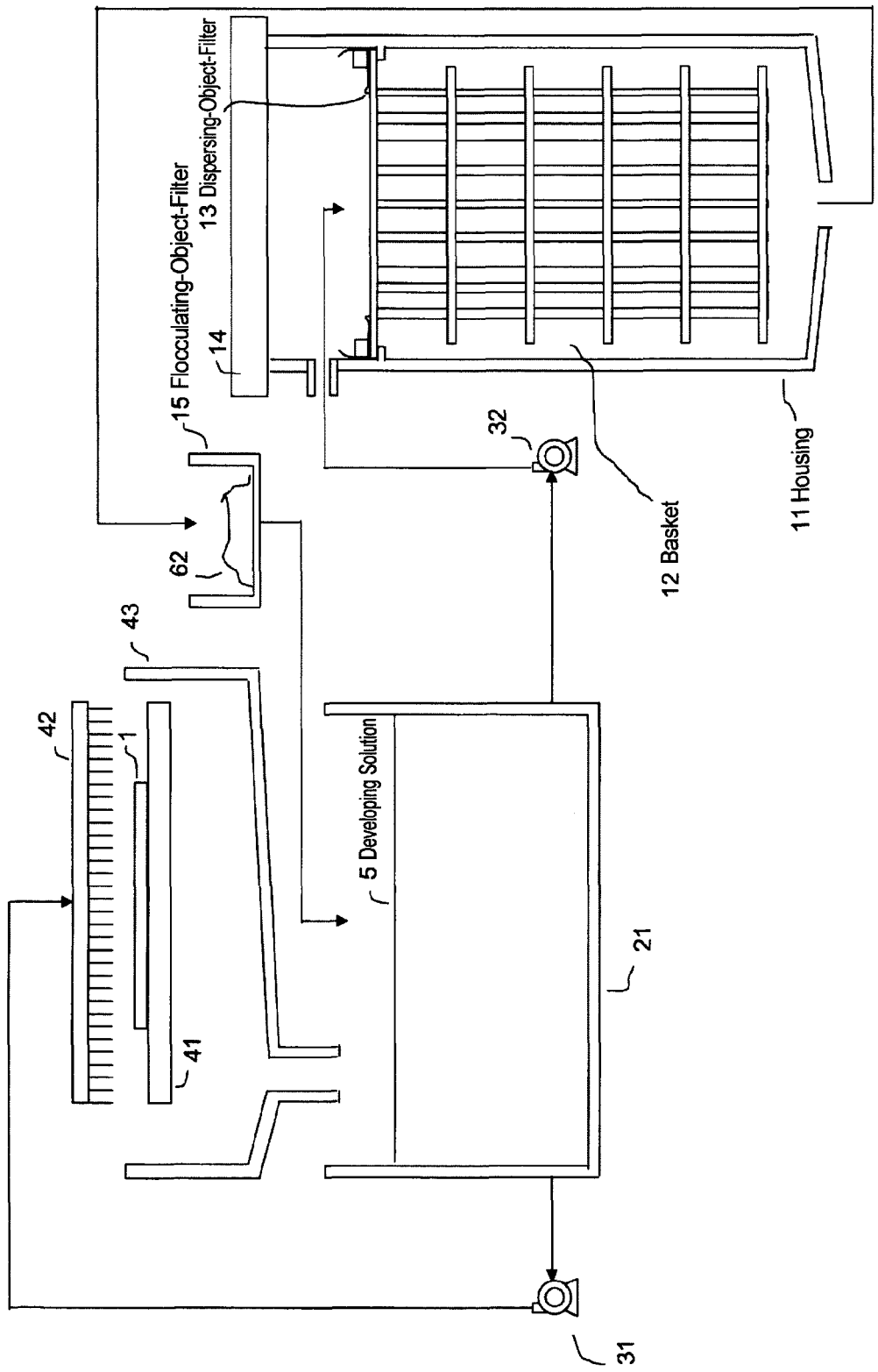
FIG. 5 is a schematic view showing a developer according to a third embodiment.
Figure 6:
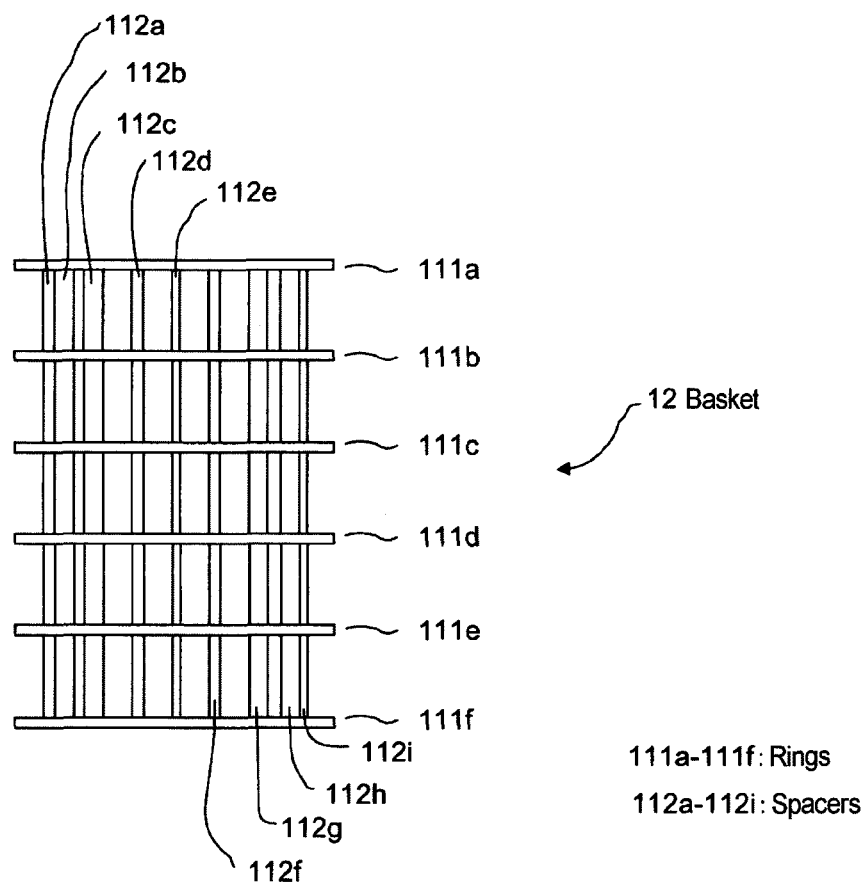
FIG. 6 is a side view showing a basket according to the third embodiment.

In the developer according to a third embodiment shown in FIG. 5, similarly to the first embodiment, the dispersing-object-filter 13 is a bag filter and comprises a polymer, for example. As shown in FIG. 6 as a side view and FIG. 7 as a top view, the basket 12 that accommodates the dispersing-object-filter 13 has approximately a cylindrical shape, and comprises a plurality of rings 111a, 111b, 111c, 111d, 111e, and 111f disposed in parallel such that the respective centers thereof may be located on the same line, and a plurality of strip-like spacers 112a, 112b, 112c, 112d, 112e, 112f, 112g, 112h, and 112i . . . that connect the inner circumferences of the plurality of rings 111a to 111f . . . to each other.

The plurality of rings 111a to 111f is congruent, for example. The plurality of spacers 112a to 112i is also congruent, for example. The plurality of spacers 112a to 112i is radially disposed so as to contact the respective inner circumferences of the plurality of rings 111a to 111f. Specifically, the plurality of spacers 112a to 112i is disposed vertically to the tangent of each inner circumference of the plurality of rings 111a to 111f. The plurality of rings 111a to 111f and the plurality of spacers 112a to 112i are made of metal such as aluminum and stainless steel, for example.

Figure 8:
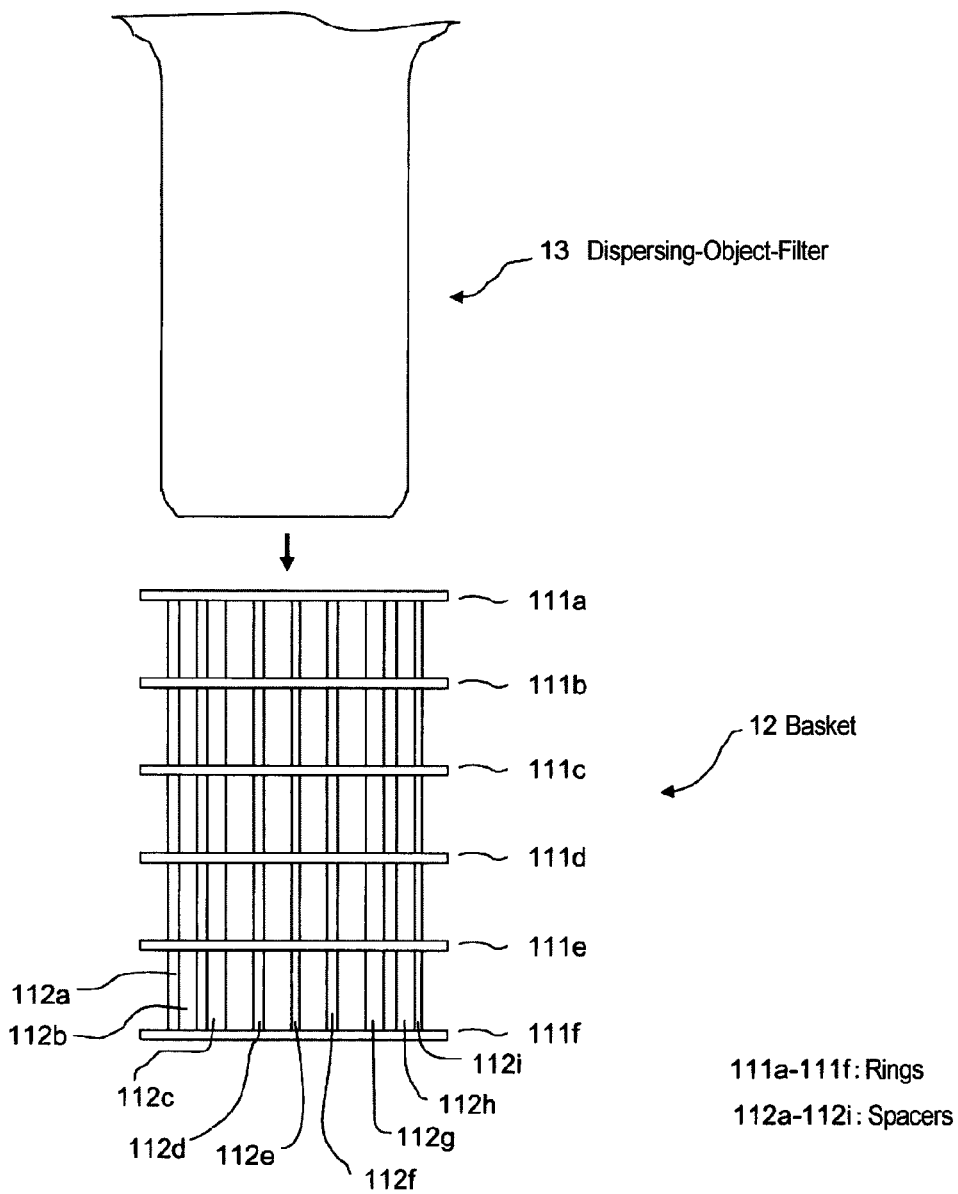
FIG. 8 is a first schematic view showing a dispersing-object-filter and a basket according to the third embodiment.
Figure 9:
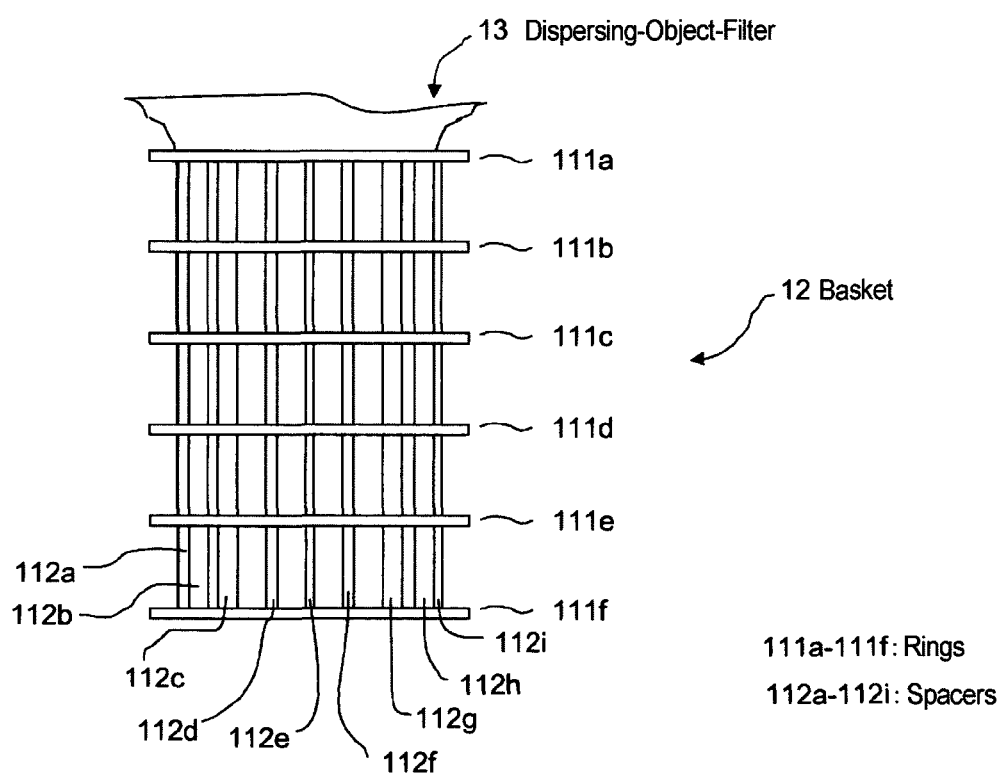
FIG. 9 is a second schematic view showing a dispersing-object-filter and a basket according to the third embodiment.
Figure 10:
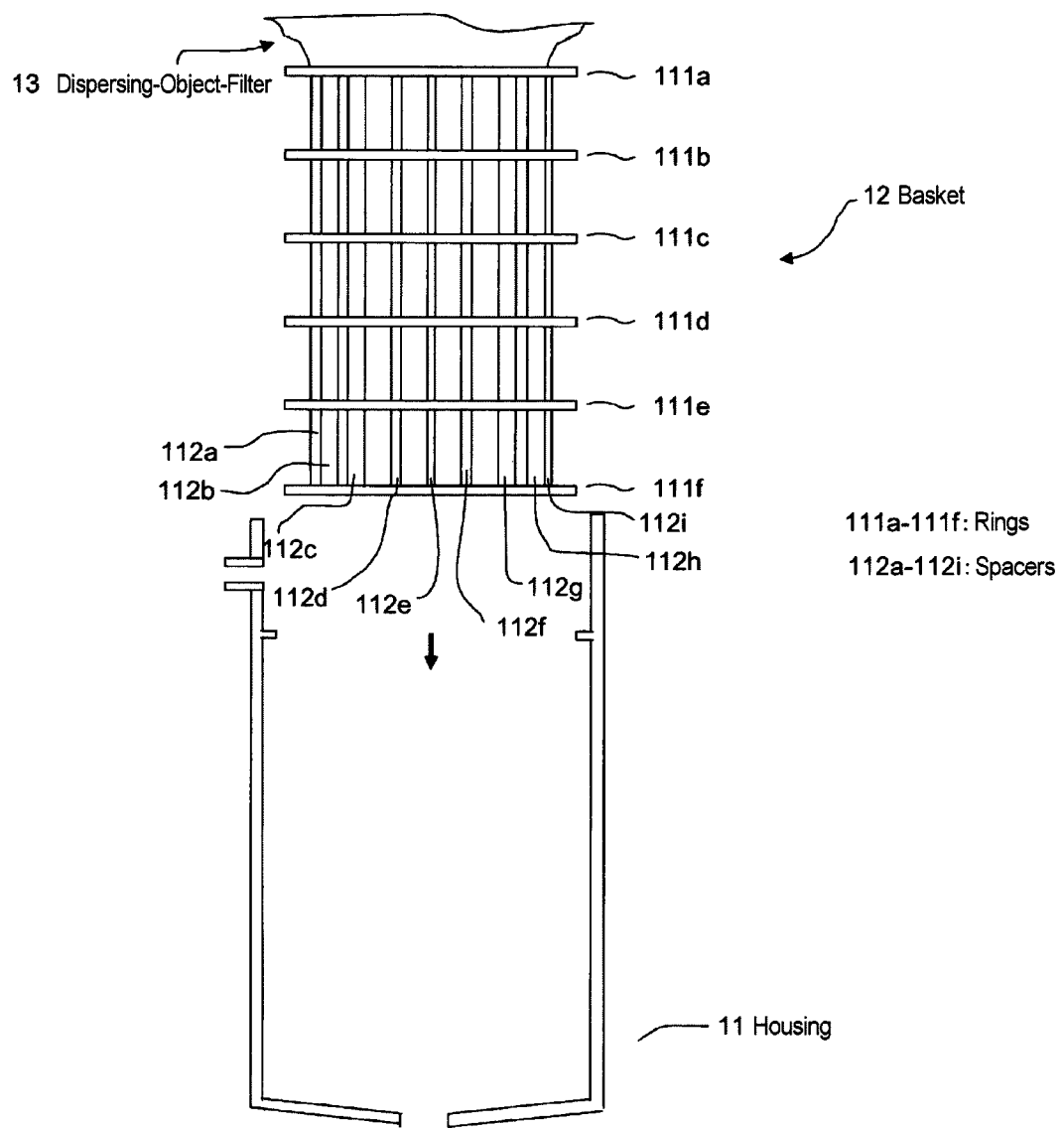
FIG. 10 is a first schematic view showing a dispersing-object-filter, a basket, and a housing according to the third embodiment.
Figure 11:
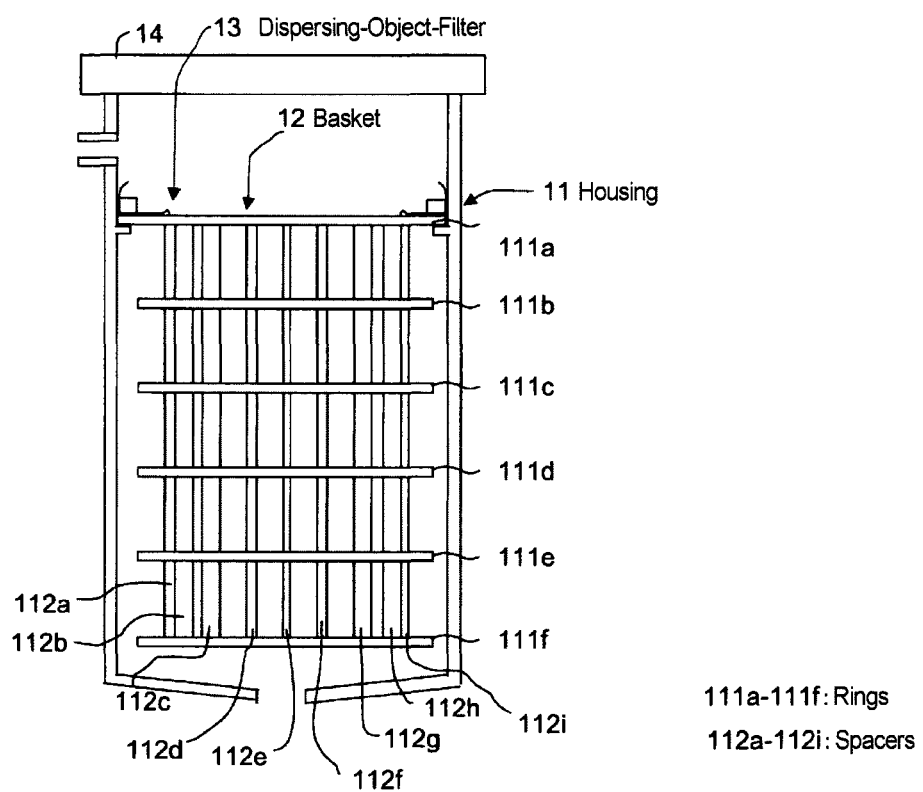
FIG. 11 is a second schematic view showing a dispersing-object-filter, a basket, and a housing according to the third embodiment.

As shown in FIGS. 8 and 9, the dispersing-object-filter 13 is accommodated within the plurality of spacers 112a to 112i. The basket 12 in which the dispersing-object-filter 13 is accommodated is housed in the cylindrical housing 11 as shown in FIG. 10, and covered with a lid 14 as shown in FIG. 11. In FIGS. 5, 10, and 11, for convenience, the dispersing-object-filter 13 and the basket 12 are shown by a side view, and the housing 11 is shown by a sectional view. When the basket 12 is housed in the housing 11, a space is provided between each of the plurality of spacers 112a to 112i of the basket 12 and the inner wall of the housing 11. A space is also provided between the plurality of rings 111a to 111f of the basket 12 and the inner wall of the housing 11.

Figure 12:
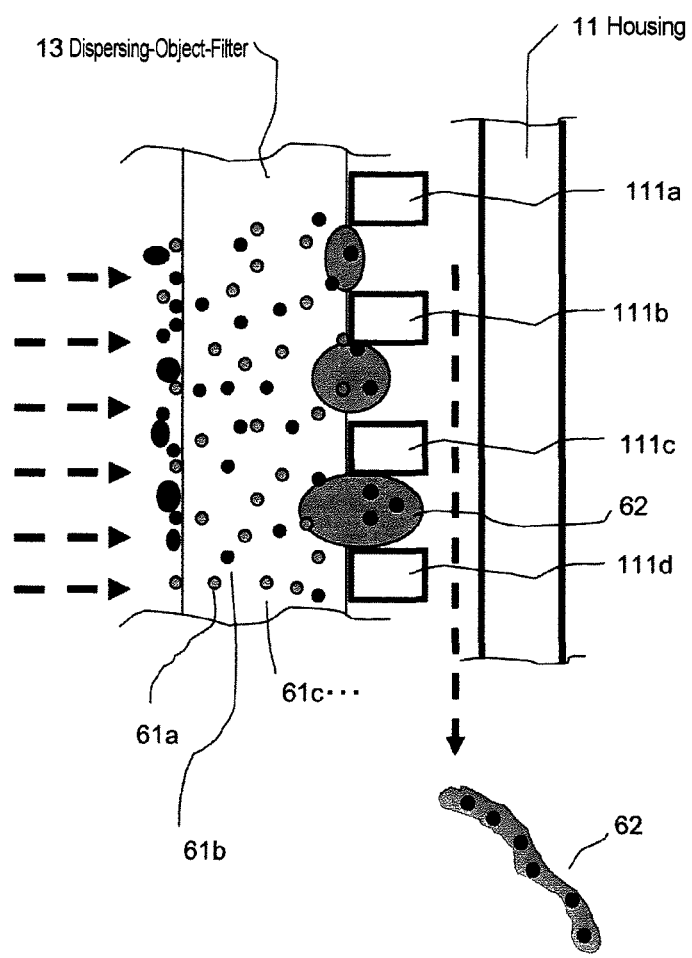
FIG. 12 is a schematic view showing a flocculation process of a photosensitive resin composition dispersing in a developing solution according to the third embodiment.

As shown in FIG. 12, photosensitive resin compositions 61a, 61b, and 61c . . . pass through the dispersing-object-filter 13 to be flocculated, and thereby flocculates 62 are deposited between the outside of the dispersing-object-filter 13 and the plurality of rings 111a to 111d of the basket 12. The space is provided between the rings 111a to 111d of the basket 12 and the inner wall of the housing 11. For this reason, the flocculates 62 separated from above the rings 111a to 111d are flowed downstream. In the case where no space is provided between the rings 111a to 111d of the basket 12 and the inner wall of the housing 11, the space between each of the plurality of spacers 112a to 112i of the basket 12 and the inner wall of the housing 11 or that between the rings 111a to 111d of the basket 12 and the inner wall of the housing 11 shown in FIG. 11 may be clogged with the flocculates. As a result, fluidity of the developing solution 5 may be reduced, and excessive pressure may be applied to the dispersing-object-filter 13. For that reason, it is preferred that the space be provided between each of the plurality of spacers 112a to 112i and the inner wall of the housing 11 and/or between the rings 111a to 111d and the inner wall of the housing 11, to prevent the plurality of spacers 112a to 112i and the rings 111a to 111d from contacting any objects other than the dispersing-object-filter 13, the developing solution 5, and the flocculates. The width of the space is 8 mm, for example.

Figure 13:
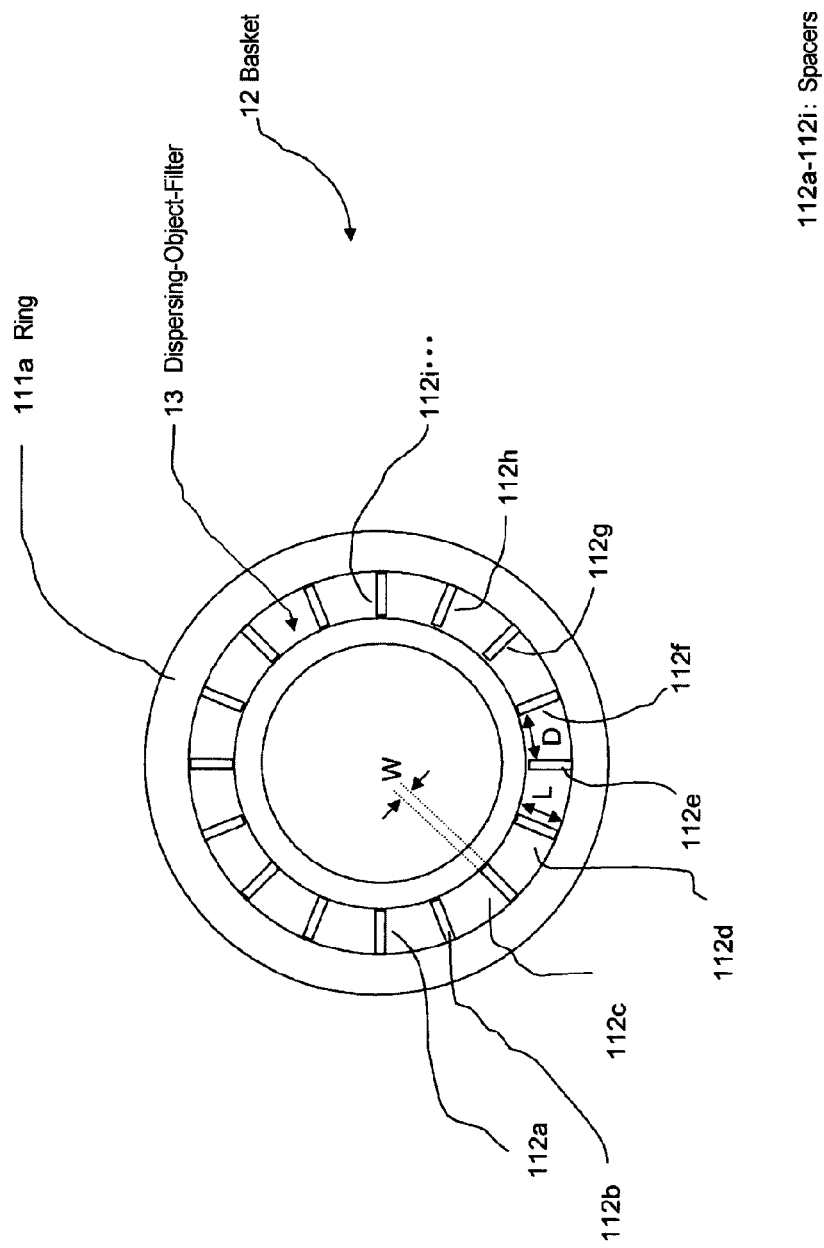
FIG. 13 is a top view showing a dispersing-object-filter and a basket according to the third embodiment.

An interval D at which the plurality of spacers 112a to 112i shown in FIG. 13 are disposed is preferably not less than 5 mm and not more than 50 mm. Preferably, the interval D means an interval between spacers in the innermost portion of the space that contacts the dispersing-object-filter. At an interval D of not less than 5 mm, the space in which the flocculates are deposited can be secured on the outside of the bag-like dispersing-object-filter 13. In the case where the inside of the bag-like dispersing-object-filter 13 is given a pressure not less than 0.02 MPa higher than that of the outside thereof, at an interval D of not more than 50 mm, deflection of the bag-like dispersing-object-filter 13 can be prevented. At an interval D of not less than 5 mm and not more than 50 mm, deflection of the dispersing-object-filter 13 is prevented, and bias of the pressure applied to the dispersing-object-filter 13 is reduced. Thereby, the photosensitive resin composition dispersing in the developing solution 5 can be efficiently flocculated, and the flocculates 62 can be efficiently pushed and flowed to the flocculating-object-filter 15.

Each width L of the plurality of spacers 112a to 112i shown in FIG. 13 is preferably not less than 3 mm and not more than 30 mm. Each thickness W of the plurality of spacers 112a to 112i is preferably shorter than the interval D at which the plurality of spacers 112a to 112i are disposed. The thickness W is preferably not less than 1/1000 and not more than 1/2 of the interval D, more preferably not less than 1/100 and not more than 1/5 thereof, and still more preferably not less than 1/70 and not more than 1/10 thereof.

The flocculates deposited on the outside of the dispersing-object-filter 13 and the basket 12 are pushed and flowed to the flocculating-object-filter 15 by pressure such as hydraulic pressure, for example. Alternatively, the deposited flocculates may be scraped by a spatula, a brush, or the like, or the deposited flocculates may be peeled off using a liquid or a gas. Thereby, quality of the printing plate produced can be further improved.

Other components of the developer according to the third embodiment shown in FIG. 5 are the same as those of the first embodiment. Also in the developer according to the third embodiment, the photosensitive resin composition dispersing in the developing solution 5 can be effectively flocculated by the dispersing-object-filter 13, and the flocculates 62 formed in the dispersing-object-filter 13 can be efficiently carried to the flocculating-object-filter 15.

Fourth Embodiment

Figure 14:
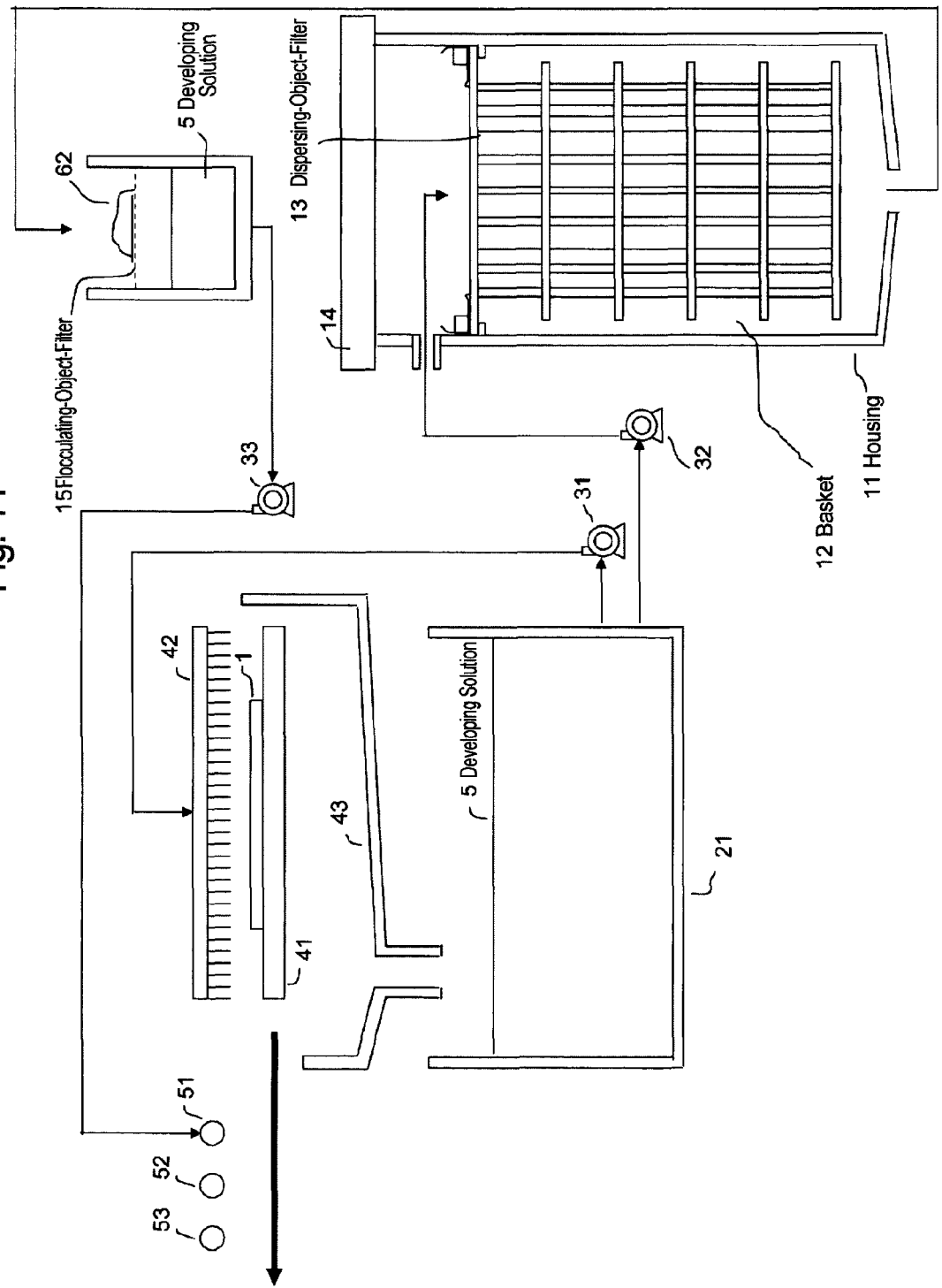
FIG. 14 is a schematic view showing a developer according to a fourth embodiment.

The developer according to a fourth embodiment further comprises a rinse brush 51 as shown in FIG. 14. In the developer shown in FIG. 14, the developing solution 5 passed through the flocculating-object-filter 15 is fed to the vicinity of the rinse brush 51 by the feeder 33 such as a pump. The exposed printing raw plate 1 from which the photosensitive resin composition of the unexposed portion is selectively removed using the developing solution 5 fed by the feeder 31 and the brush 42 is conveyed by the movable stage 41 to under the rinse brush 51.

In the case where the exposed printing raw plate 1 is conveyed to under the rinse brush 51, the feeder 31 may spray the developing solution 5 passed through the flocculating-object-filter 15 to the exposed printing raw plate 1, or may feed the developing solution such that the surface of the printing raw plate 1 may be covered with the developing solution. The exposed printing raw plate 1 may be immersed in the developing solution 5 passed through the flocculating-object-filter 15. The surface of the exposed printing raw plate 1 is cleaned up by the rinse brush 51 to remove the developing solution 5 that may remain on the surface of the exposed printing raw plate 1 and comprises the dispersing photosensitive resin composition and the flocculated photosensitive resin composition.

In the related art, if the developing solution used for development of the exposed printing raw plate is reused to rinse the exposed printing raw plate, the photosensitive resin composition dispersing in the developing solution may adhere to the exposed printing raw plate again. For that reason, in the related art, the exposed printing raw plate is rinsed using a unused fresh developing solution. In contrast to this, in the developer according to the fourth embodiment, the photosensitive resin composition dispersing in the developing solution 5 is flocculated by the dispersing-object-filter 13, and the flocculated photosensitive resin composition are caught in the flocculating-object-filter 15. For that reason, the concentration of the dispersing photosensitive resin composition is extremely low in the developing solution 5 passed through the flocculating-object-filter 15. Accordingly, the developing solution 5 passed through the flocculating-object-filter 15 can be reused to rinse the exposed printing raw plate 1 after development. Reuse of the developing solution 5 passed through the flocculating-object-filter 15 can reduce the amount of the developing solution 5 to be used, and can also reduce cost at the developing step.

The developer according to the fourth embodiment may comprise several another rinse brushes 52 and several washing brushes 53. In the case where the exposed printing raw plate 1 after rinsing is conveyed by the movable stage 41 to under the rinse brush 52 and the washing brush 53, a developing solution comprising no resin component is sprayed from the rinse brush 52, pure water or the like is sprayed from the washing brush 53 to the exposed printing raw plate 1, and the exposed printing raw plate 1 is cleaned up by the rinse brush 52 and the washing brush 53. Thereby, the resin components and developing solution that remain on the surface of the exposed printing raw plate 1 can be further washed away. The developing solution 5 passed through the flocculating-object-filter 15 may be used for the developing solution sprayed from the rinse brush 52. Use of the developing solution 5 passed through the flocculating-object-filter 15 can reduce the amount of the developing solution to be prepared newly.

Fifth Embodiment

Figure 15:
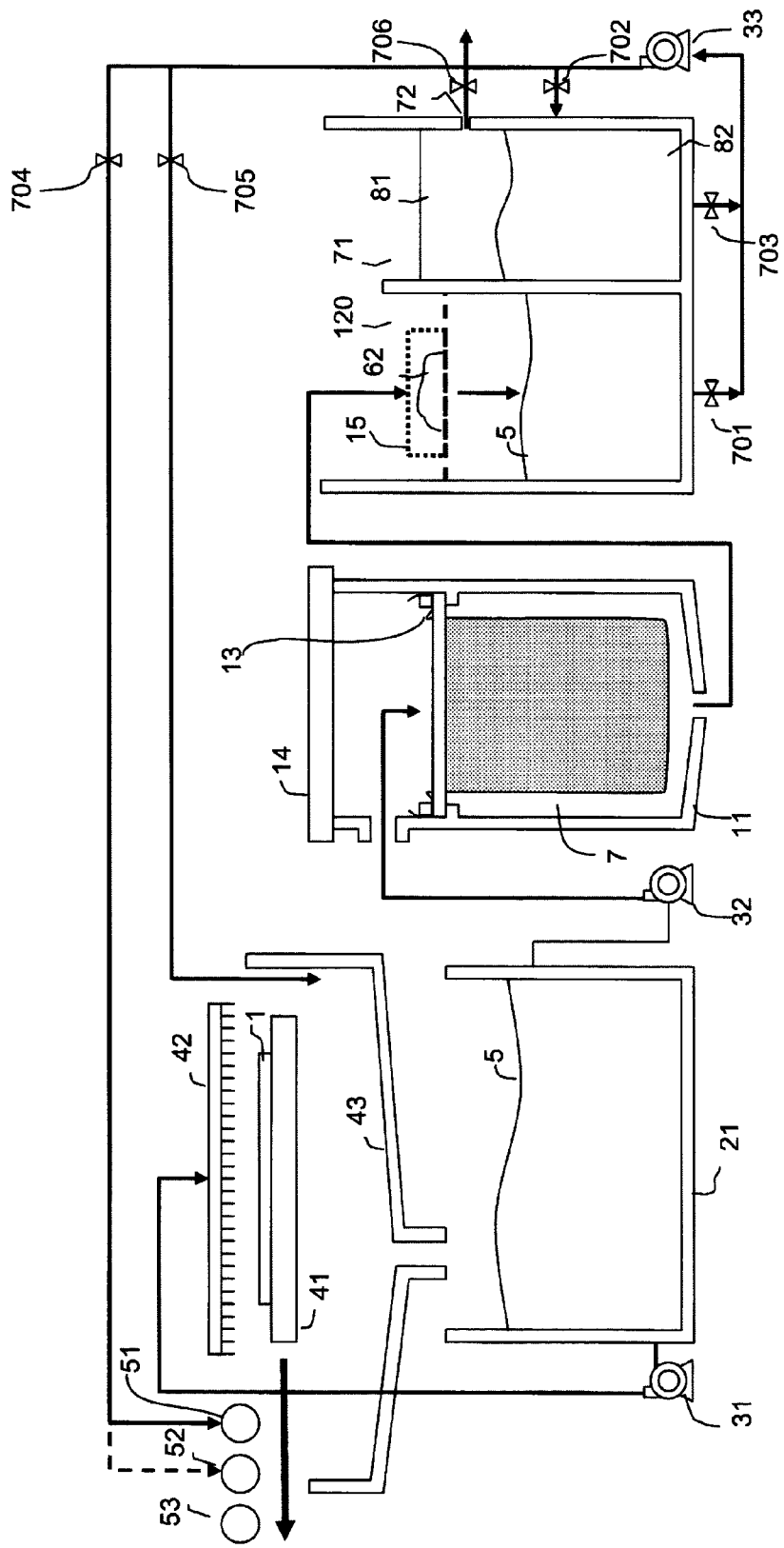
FIG. 15 is a schematic view showing a developer according to a fifth embodiment.
Figure 16:
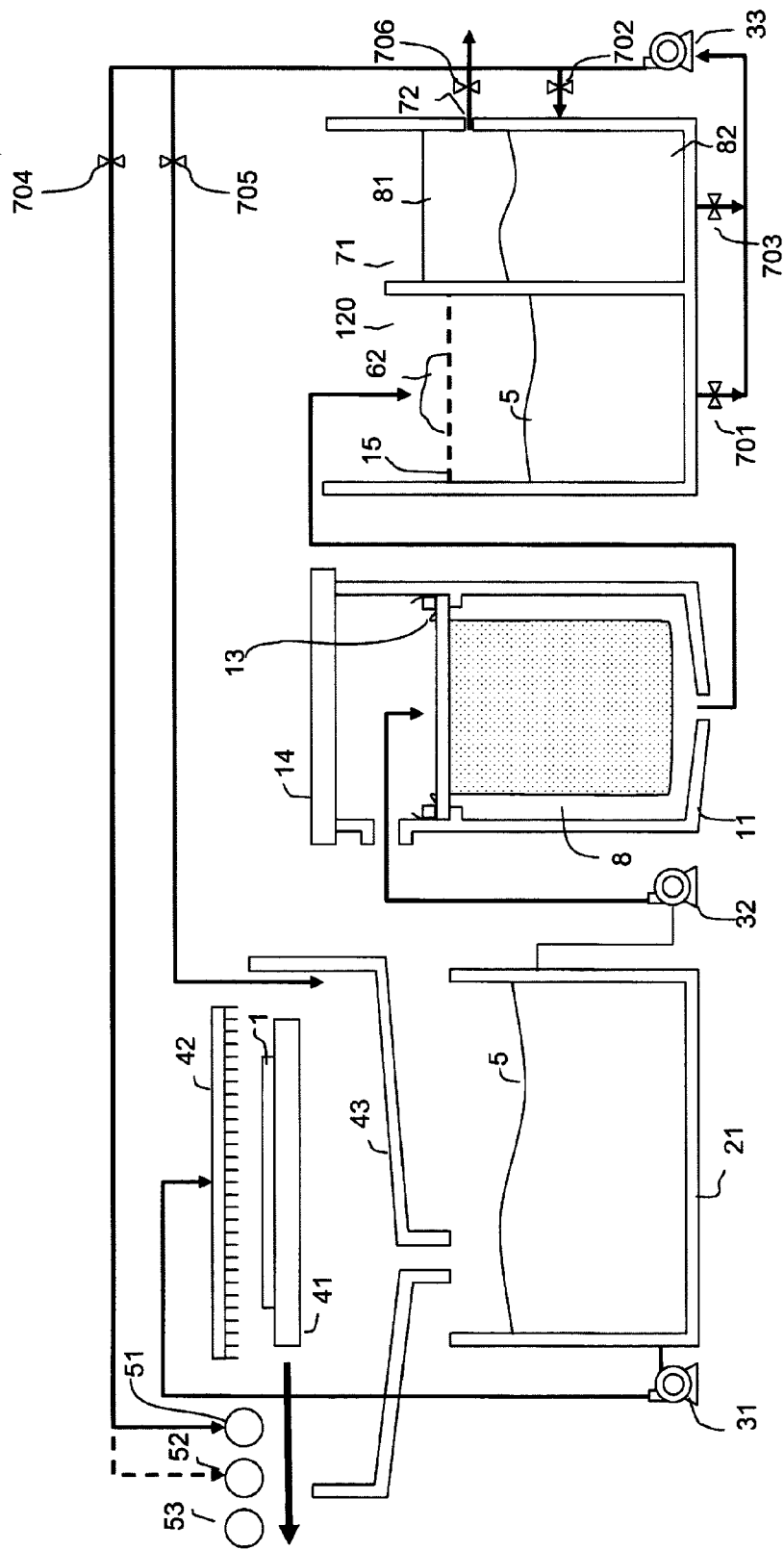
FIG. 16 is a schematic view showing a developer according to the fifth embodiment.
Figure 17:
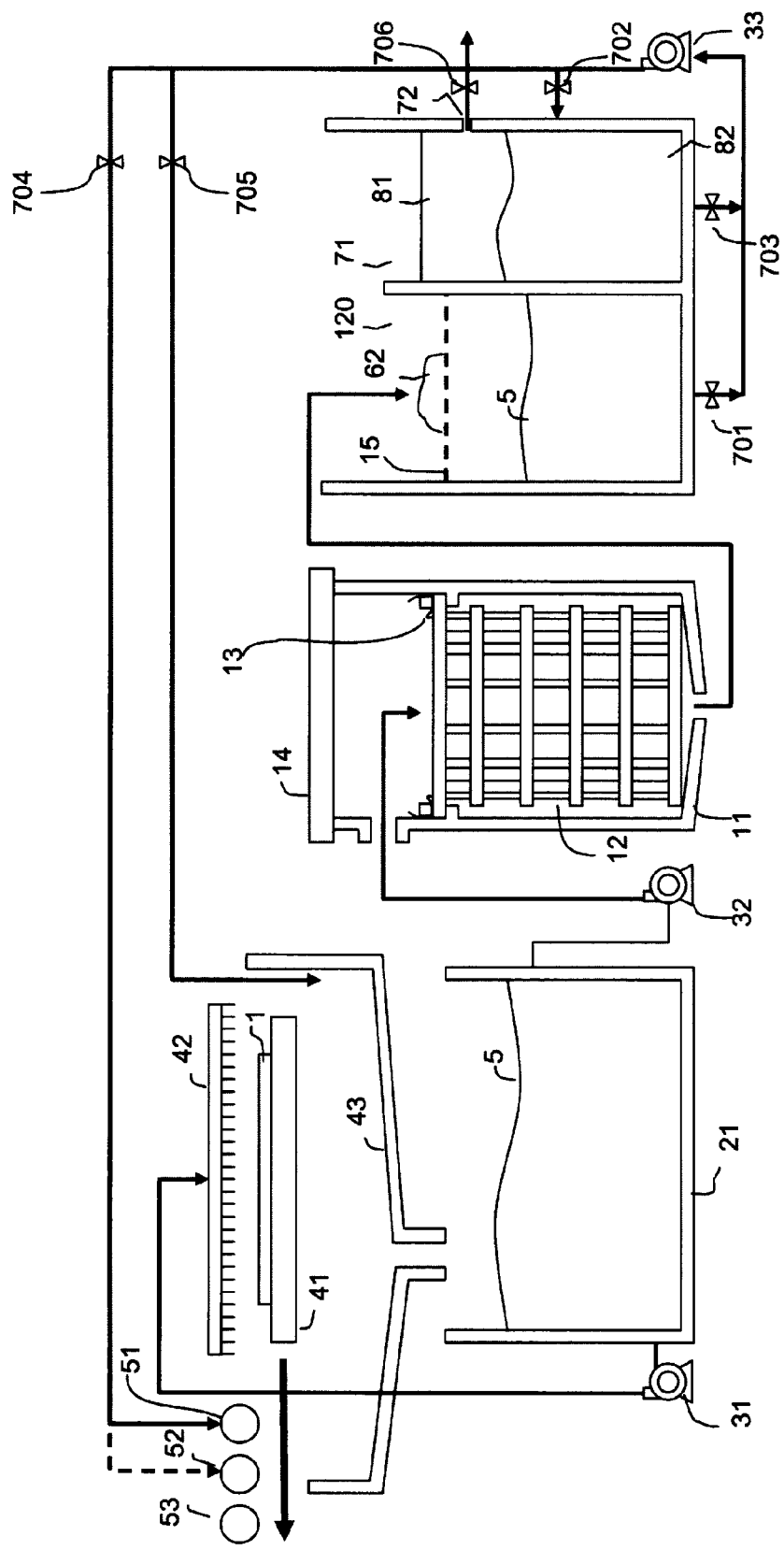
FIG. 17 is a schematic view showing a developer according to the fifth embodiment.

The developer and filter apparatus according to the present embodiment may further comprise a settling tank for the developing solution passed through the flocculating-object-filter. In the developer according to a fifth embodiment shown in FIGS. 15 to 17, the developer may comprise a settling tank 71. The developing solution 5 passed through the flocculating-object-filter 15 may be directly fed to the settling tank 71, or may be fed to the settling tank 71 by the feeder 33 after the developing solution 5 is once fed to a developing solution tank 120 for a developing solution passed through the flocculating-object-filter 15 as shown in FIGS. 15 to 17. In the case where the developing solution tank 120 for a developing solution passed through the flocculating-object-filter 15 is provided, the developing solution tank 120 and/or the settling tank 71 may be provided with a temperature control mechanism for the developing solution. In the case where the developing solution tank 120 for a developing solution passed through the flocculating-object-filter 15 is provided, a structure in which the developing solution tank 120 and the settling tank 71 are separated by a partition is preferred. By the structure, the developing solution overflowed from the settling tank returns to the developing solution tank again without leakage to the outside. For this reason, such a structure is preferred from the viewpoint of safety.

Part or all of the developing solution passed through the flocculating-object-filter 15 is fed to the settling tank. In FIGS. 15 to 17, valves 701 and 702 are opened to operate the feeder 33. Thereby, part or all of the developing solution can be fed to the settling tank 71.

In the present embodiment, settling means the state where the developing solution in the settling tank is separated into a high concentration layer and a low concentration layer. For example, settling in the present embodiment means the state where no developing solution flows into the settling tank at all, and any state where the developing solution in the settling tank is separated into a high concentration layer and a low concentration layer even if the developing solution continuously flows into the settling tank. Whether one of the high concentration layer and the low concentration layer is on the upper layer side or the lower layer side in the settling tank changes with the specific gravity of the dispersing object to the developing solution, and is not particularly limited.

From the viewpoint of efficiency of separating the developing solution into the high concentration layer 81 and the low concentration layer 82 in the settling tank 71, it is preferred that the developing solution passed through the flocculating-object-filter 15 is not fed to the settling tank 71 during a period of time when a fixed amount of the developing solution is fed to the settling tank 71 and the high concentration layer 81 is separated from the low concentration layer 82 by settling, and that the developing solution is fed to the developing solution tank 21 when a valve 705 is opened.

By settling the developing solution passed through the flocculating-object-filter 15 in the settling tank 71, the developing solution is separated into the high concentration layer 81 mainly comprising the photosensitive resin composition and the low concentration layer 82 mainly comprising the developing solution. The time to settle the developing solution is not particularly limited as long as a fixed amount of the high concentration layer and that of low concentration layer are separated. From the viewpoint of productive efficiency, settling for not less than 5 minutes and not more than 24 hours is preferred, and settling for not less than 10 minutes and not more than 12 hours is more preferred.

From the viewpoint of a degree of separation, it is preferred that at least not less than 40 percent and preferably not less than 60 percent of the low concentration layer based on the volume of the developing solution in the settling tank be obtained by settling of the developing solution passed through the flocculating-object-filter.

In the present embodiment, the high concentration layer and the low concentration layer mean the layers having relatively different concentrations of the photosensitive resin composition of each layer. In the present embodiment, the photosensitive resin composition included in the high concentration layer and low concentration layer refer to all the components included in the photosensitive resin composition layer.

The concentration of the high concentration layer and that of the low concentration layer depend on the developing solution and photosensitive resin composition to be used, and is not particularly limited. The concentration of the photosensitive resin composition in the low concentration layer is any concentration lower than the concentration of the photosensitive resin composition in the developing solution before separation, and not particularly limited. From the viewpoint of continuous platemaking, the concentration of not less than 0.001 g/L and not more than 20 g/L is preferred, that of not less than 0.001 g/L and not more than 15 g/L is more preferred, and that of not less than 0.001 g/L and not more than 10 g/L are still more preferred. The concentration of the photosensitive resin composition in the high concentration layer is any concentration higher than the concentration of the photosensitive resin composition in the developing solution before separation, and not particularly limited. The concentration is preferably not less than 1.5 times, more preferably not less than 2 times, and still more preferably not less than 5 times based on the concentration of the low concentration layer.

In order to accelerate the separation rate of the developing solution into the high concentration layer and the low concentration layer, an alkali builder or the like may be added to the developing solution in the range in which performance of the developing solution is not influenced, or operation to increase the temperature of the developing solution in the settling tank only or the entire developing solution may be performed. In the case where the concentration of the photosensitive resin composition in the developing solution is high, the developing solution tends to be separated into the high concentration layer and the low concentration layer for a short time.

The high concentration layer separated in the settling tank 71 is preferably removed from the settling tank. In FIGS. 15 to 17, the high concentration layer 81 is exemplified as the upper layer of the low concentration layer 82. Examples of a method for removing a high concentration layer include, but not limited to, a method for providing an exit according to the specific gravity of the high concentration layer and the low concentration layer, a method for overflowing a high concentration layer to a tank for recovering a high concentration layer in the case where the specific gravity of the high concentration layer is smaller than that of a low concentration layer, and a method for downflowing a high concentration layer to a tank for recovering a high concentration layer in the case where the specific gravity of the high concentration layer is greater than that of a low concentration layer. From the viewpoint of ease removal of the high concentration layer, the settling tank 71 preferably has an exit 72 for extracting the high concentration layer. The position of the exit 72 is not particularly limited as long as the high concentration layer can be extracted. The exit is preferably located in an upper portion of the settling tank if the specific gravity of the high concentration layer is smaller than that of the low concentration layer. The exit is preferably located in a lower portion of the settling tank if the specific gravity of the high concentration layer is greater than that of the low concentration layer. In FIGS. 15 to 17, a valve 706 can be opened to remove the high concentration layer 81 from the exit 72. While the method for removing the high concentration layer has been exemplified, the low concentration layer separated in the settling tank may be extracted.

The low concentration layer separated in the settling tank may be fed to the developing solution tank 21, or may be fed to the exposed printing raw plate 1 at the developing step as a developing solution.

As shown in FIGS. 15 to 17, the developer may further include the rinse brush 51. The low concentration layer separated in the settling tank may be fed to the rinse brush, or may be used as a rinse solution for the photosensitive resin composition layer after the developing step. The low concentration layer separated in the settling tank has an extremely small amount of the dispersed and flocculated photosensitive resin composition. Accordingly, use of the low concentration layer as a rinse fed to the rinse brush is preferred. In FIGS. 15 to 17, the valve 703 and the valve 704 can be opened to feed the low concentration layer the rinse brush 51.

In the present embodiment, the developing solution is settled in the settling tank, and thereby the dispersing photosensitive resin composition is separated as the high concentration layer. Thereby, the high concentration layer to be discarded can be obtained simply and selectively, and the amount of the developing solution to be discarded can be reduced.

As shown in FIGS. 15 to 17, in the case where the developer comprises the rinse brush 51, the exposed printing raw plate 1 from which the photosensitive resin composition of the unexposed portion is selectively removed using the developing solution 5 fed by the feeder 31 and the brush 42 is conveyed by the movable stage 41 to under the rinse brush 51.

In the case where the exposed printing raw plate 1 is conveyed to under the rinse brush 51, although not illustrated in FIGS. 15 to 17, the developing solution 5 passed through the flocculating-object-filter 15 may be sprayed from the feeder 31 to the exposed printing raw plate 1 conveyed to under the rinse brush 51, or may be fed such that the surface of the exposed printing raw plate may be covered with the developing solution. The exposed printing raw plate 1 may be immersed in the developing solution 5 passed through the flocculating-object-filter 15. The developing solution 5 passed through the flocculating-object-filter 15 may be directly sprayed from the feeder 33 to the exposed printing raw plate 1, or may be fed such that the surface of the exposed printing raw plate may be covered with the developing solution. The printing raw plate 1 may be immersed in the developing solution 5 passed through the flocculating-object-filter 15. Further, the low concentration layer separated the settling tank may be sprayed from the feeder 33 to the exposed printing raw plate 1, or may be fed such that the surface of the exposed printing raw plate may be covered with the low concentration layer. The exposed printing raw plate 1 may be immersed in the low concentration layer. The surface of the exposed printing raw plate 1 is cleaned up by the rinse brush 51 to remove the developing solution 5 that may comprise the dispersing photosensitive resin composition and may remain on the surface of the exposed printing raw plate 1 and the flocculated photosensitive resin composition.

In the related art, if the developing solution used for development of the exposed printing raw plate is reused to rinse the exposed printing raw plate, the photosensitive resin composition dispersing in the developing solution may adhere to the exposed printing raw plate again. For that reason, in the related art, the exposed printing raw plate is rinsed using an unused fresh developing solution. In contrast to this, in the developer according to the fifth embodiment, the photosensitive resin composition dispersing in the developing solution 5 is flocculated by the dispersing-object-filter 13, the photosensitive resin composition flocculated by the flocculating-object-filter 15 is caught, and the dispersing photosensitive resin composition not caught by the dispersing-object-filter and the flocculating-object-filter is separated as the high concentration layer in the settling tank 71. For that reason, the low concentration layer 82 in the settling tank 71 has an extremely low concentration of the dispersing photosensitive resin composition, and thus the low concentration layer 82 in the settling tank 71 can be suitably used as a rinse solution for the exposed printing raw plate 1 after development. Preferably, no flocculant or the like is added to the low concentration layer 82 in the settling tank 71. Reuse of the low concentration layer 82 in the settling tank 71 can reduce the amount of the developing solution 5 to be used, and can reduce cost at the developing step. The developing solution passed through the flocculating-object-filter 15 can also be used as a rinse solution depending on the state of the developing solution.

The developer according to the fifth embodiment may comprise several another rinse brushes 52 and several washing brushes 53. In the case where the exposed printing raw plate 1 after rinsing is conveyed by the movable stage 41 to under the rinse brush 52 and the washing brush 53, a developing solution comprising no resin component is sprayed from the rinse brush 52, pure water or the like is sprayed from the washing brush 53 to the exposed printing raw plate 1, and the exposed printing raw plate 1 is cleaned up by the rinse brush 52 and the washing brush 53. Thereby, the photosensitive resin composition component and developing solution that remain on the surface of the exposed printing raw plate 1 can be further washed away. The low concentration layer 82 in the settling tank 71 may be used for the developing solution sprayed from the rinse brush 52. Use of the low concentration layer 82 in the settling tank 71 can reduce the amount of the developing solution to be prepared newly.

According to the developer according to the fifth embodiment, the photosensitive resin composition dispersing in the developing solution 5 can be flocculated by the dispersing-object-filter 13, the flocculates can be efficiently removed from the developing solution 5 by the flocculating-object-filter 15, and the dispersing photosensitive resin composition included in the developing solution can be separated as the high concentration layer by the settling tank 71.

The developing solution used in the conventional developing step without using the dispersing-object-filter 13 is not separated into the high concentration layer and the low concentration layer even if it is settled for not less than one day, unless the developing solution is heated or the concentration of sodium carbonate in the developing solution is increased. It was a result not expected at all, however, that settling of the developing solution after passed through the dispersing-object-filter 13 causes separation of the developing solution into the high concentration layer and the low concentration layer without heating the developing solution or increasing the concentration of sodium carbonate in the developing solution. Although the mechanism is not clear, it is presumed as follows: the developing solution passes through the dispersing-object-filter 13, and thereby the component of the surface active agent in the developing solution is isolated from the photosensitive resin composition, or the surface active agent is incorporated into the flocculates; then, the component of the surface active agent needed to keep the developing solution dispersed is relatively reduced; for this reason, separation of the developing solution into the high concentration layer and the low concentration layer only by settling is facilitated after the photosensitive resin composition flocculated by the flocculation filter is removed.

Because the photosensitive resin composition is flocculated by the dispersing-object-filter 13 without using a flocculant that weakens the surface active agent, the developing solution 5 passed through the flocculating-object-filter 15 can be used at the developing step again.

Moreover, the low concentration layer 82 in the settling tank 71 has an extremely small content of the dispersing photosensitive resin composition, and can be suitably used as a rinse solution.

As other embodiment according to the present invention, a printing plate can be produced using a developer according to the present embodiment. A process for producing a printing plate according to the present embodiment comprises the steps of: feeding a developing solution to an exposed photosensitive resin composition layer; passing the developing solution in which photosensitive resin composition is dispersed through a dispersing-object-filter to flocculate the photosensitive resin composition dispersing in the developing solution by the dispersing-object-filter; and removing the flocculated photosensitive resin composition from the developing solution passed through the dispersing-object-filter. In addition to the feeder 31 or 32, a separate feeder that can feed the developing solution to the exposed printing raw plate 1 may also be provided in the present embodiment. The developing solution is fed to the exposed printing raw plate 1 by the feeder 31 to feed the developing solution to the exposed photosensitive resin composition layer. Then, the developing solution in which the photosensitive resin composition obtained by developing the photosensitive resin composition layer is dispersed is collected in the developing solution tank 21, and fed from the developing solution tank 21 to the dispersing-object-filter 13 through the feeder 32. The photosensitive resin composition dispersing in the developing solution is flocculated by the dispersing-object-filter 13. The developing solution passed through the dispersing-object-filter is sent to the flocculation filter 15 to remove the photosensitive resin composition flocculated by the flocculating-object-filter 15.

As further other embodiment according to the present invention, a process for producing a printing plate according to the present embodiment may comprise the steps of: feeding a developing solution to an exposed photosensitive resin composition layer; passing the developing solution in which photosensitive resin composition are dispersed through a dispersing-object-filter to flocculate the photosensitive resin composition dispersing in the developing solution by the dispersing-object-filter; removing the flocculated photosensitive resin composition from the developing solution passed through the dispersing-object-filter; and settling the developing solution, from which the flocculated photosensitive resin composition is removed, in a settling tank to separate the developing solution into a high concentration layer and a low concentration layer. The developing solution in which the photosensitive resin composition obtained by developing the photosensitive resin composition layer is dispersed is collected in the developing solution tank 21, and fed from developing solution tank 21 to the dispersing-object-filter 13 through the feeder 32. Then, the photosensitive resin composition dispersing in the developing solution is flocculated by the dispersing-object-filter 13. The developing solution passed through the dispersing-object-filter is sent to the flocculation filter 15 to remove the photosensitive resin composition flocculated by the flocculation filter 15. Then, the developing solution passed through the flocculation filter is settled in the settling tank to be separated into the high concentration layer and the low concentration layer. The high concentration layer may be extracted from the exit provided in the settling tank. The low concentration layer may be fed to the rinse brush, or may be fed to the developing solution tank 21. In the present embodiment, without being sent to the settling tank, the developing solution passed through the flocculation filter may be directly sent to the developing solution tank in the range in which it is not deviated from the object of the present invention.

EXAMPLES

In order to describe the embodiments of the present invention more in detail, Examples and Comparative Examples will be shown below. These Examples, however, specifically show description of the embodiments according to the present invention and the effects and the like obtained by the description, and do not limit the embodiments according to the present invention at all.

Production Example 1

A printing raw plate "DEF-20" (trademark) made by Asahi Kasei E-materials Corp. was prepared, the printing raw plate being prepared by laminating a support made of PET, a photosensitive resin composition layer, and an infrared laser ablation layer in this order, and formed into a sheet form measuring 900 mm long, 1067 mm wide, and 1.14 mm thick.

The printing raw plate was exposed from the support side using an ultraviolet-rays exposure machine made by Asahi Kasei E-materials Corp. "AFP-912EDLF" (trademark) such that the thickness of a cured layer including the thickness of the support of the printing raw plate might be 0.54 mm. Next, a pattern at an image area rate of 30% was drawn in the infrared ablation layer using a laser drawing machine "CDI SPARK 4260" (trademark) made by ESKO ARTWORKS.

Next, the printing raw plate was exposed for 7 minutes from the infrared ablation layer side by the exposure machine to obtain an exposed printing raw plate.

Example 1

Performance of treatment of the developing solution was evaluated using the developer described in the first embodiment.

<Description of Apparatus Used>

As a pressure filtration apparatus comprising the basket 7, the housing 11, the lid 14, the fixing ring 16, and the feeder 32, a pressure filtration apparatus "Kasupon filter MCF-0420TS" (trademark) made by Mitaka, Co., Ltd. was used. The lid 14 was closed.

As the dispersing-object-filter 13 attached to the pressure filtration apparatus, a polypropylene filter "R-10-PP-12-ES" (trademark) (thickness of 2.3 mm, density of 0.147 g/cm$^3$) made by Kajika Corporation was used.

As the flocculating-object-filter 15, a nylon mesh (opening of 0.3 mm) was used.

As the developer comprising the stage 41, the brush 42, and the developing tank 43, an aqueous development printing developing machine "AWP-220W" (trademark) made by Asahi Kasei E-materials Corp. was used.

As the developing solution 5, 250 lit. of a fresh developing solution was prepared in the developing solution tank 21, the developing solution being prepared by diluting "W300" (trademark) made by Asahi Kasei E-materials Corp. by water such that the concentration might be 6 wt %, and comprising 0.4 wt % of sodium carbonate.

<Steps>

(1) The feeder 32 was operated to sequentially circulate the fresh developing solution 5 from the developing solution tank 21 through dispersing-object-filter 13 to the flocculating-object-filter 15.

(2) The feeder 31 was operated to feed the developing solution 5 passed through the brush 42 to an unexposed printing raw plate "DEF-20" (trademark) made by Asahi Kasei E-materials Corp. and mounted on the stage 41. The photosensitive resin composition and infrared ablation layer of the printing raw plate were developed by the developing solution 5. The developing solution 5 comprising the dispersing photosensitive resin composition, the flocculated photosensitive resin composition, and the infrared ablation layer was returned to the developing solution tank 21.

The developing solution 5 comprising the dispersing photosensitive resin composition, the flocculated photosensitive resin composition, and the infrared ablation layer was fed to the dispersing-object-filter 13 through the feeder 32, and the dispersing photosensitive resin composition began to be flocculated by the dispersing-object-filter.

After the photosensitive resin composition layer and infrared ablation layer of the printing raw plate were all removed, the printing raw plate was dismounted from the stage 41. Another non-exposed printing raw plate "DEF-20" (trademark) was mounted on the stage 41, and the developing solution 5 was fed to the non-exposed printing raw plate to develop the photosensitive resin composition layer and the infrared ablation layer by the developing solution 5. This procedure was repeated to develop eighteen non-exposed printing raw plates in total.

(3) When 3.5 hours had passed since the feeder 31 was operated, the flocculated photosensitive resin composition component began to be pushed out from the dispersing-object-filter 13, and caught by the flocculating-object-filter 15. It took 7.5 hours until the photosensitive resin composition layers and infrared ablation layers of the eighteen printing raw plates all were dissolved in the developing solution. The total of the mass of the developed photosensitive resin composition layer component obtained by subtracting the masses of the photopolymerizable unsaturated monomer component and photopolymerization initiator component therefrom and the mass of the infrared ablation layer was 12 kg.

(4) The feeder 31 and the feeder 32 were further operated for 1 hour after the photosensitive resin composition layers and infrared ablation layers of the eighteen printing raw plates all were dissolved in the developing solution. Subsequently, the feeder 31 and the feeder 32 were stopped. The pressure $P_1$ on the internal surface side of the dispersing-object-filter was increased to 0.26 MPa at the maximum from start of development of the printing raw plate 1 to stop of the feeders. The pressure $P_2$ on the external surface side of the dispersing-object-filter was constant at 0.1 MPa (atmospheric pressure).

(5) After the feeder 31 and the feeder 32 were stopped and treatment of the developing solution was completed, the weight of the flocculate caught by the dispersing-object-filter 13 and the flocculating-object-filter 15 was measured. Then, the flocculate was hardly observed within the dispersing-object-filter 13, but 4.5 kg of flocculate was recovered on the inside and outside of the dispersing-object-filter 13, and 3.5 kg of flocculate was recovered on the flocculating-object-filter 15, respectively.

Considering that the total of the mass of the developed photosensitive resin composition layer component obtained by subtracting the masses of the photopolymerizable unsaturated monomer component and photopolymerization initiator component therefrom and the weight of the infrared ablation layer was 12 kg, the developing solution treated by the procedure above included 4 kg of the photosensitive resin composition component (except the photosensitive resin composition layer component and the photopolymerizable unsaturated monomer component) and the infrared ablation layer component in total.

Example 2

Treatment performance of the developing solution was evaluated in the same manner as that in Example 1 except that a pressure filtration apparatus "Eco Filter EF803" (trademark) made by Russell Finex Ltd. was used as the pressure filtration apparatus, and a stainless steel mesh filter having an opening of 10 μm, which was described according to the second embodiment, was attached as the dispersing-object-filter 13. 2.0 kg of flocculate was recovered on the inside of the dispersing-object-filter 13, 0.2 kg of flocculate was recovered on the outside thereof, and 2.0 kg of flocculate was recovered on the flocculating-object-filter 15, respectively.

No basket was used as described in the second embodiment.

Example 3

Continuous platemaking performance of the printing plate was evaluated using the developer in FIG. 1.

<Description of Apparatus Used>

As a pressure filtration apparatus comprising the basket 7, the housing 11, the lid 14, the fixing ring 16, and the feeder 32, a pressure filtration apparatus "Kasupon filter MCF-0420TS" (trademark) made by Mitaka, Co., Ltd. was used.

As the dispersing-object-filter 13 attached to the pressure filtration apparatus, a polypropylene filter "R-1-PP-12-ES" (trademark) (thickness of 2.4 mm, density of 0.174 g/cm$^3$) made by Kajika Corporation was used.

As the flocculating-object-filter 15, a nylon mesh (opening of 0.3 mm) was used.

As the developer comprising the stage 41, the brush 42, and the developing layer 43, an aqueous development printing developing machine "AWP-220W" (trademark) made by Asahi Kasei E-materials Corp. was used.

As the developing solution 5, the developing solution treated in the same manner as in Example 1 was used.

<Step>

(1) The feeder 32 was operated to sequentially circulate the developing solution 5 treated in the same manner as Example 1 from the developing solution tank 21 through the dispersing-object-filter 13 to the flocculating-object-filter 15.

(2) The exposed printing raw plate obtained in the same manner as that in Production Example 1 was mounted on the stage 41.

(3) The feeder 31 was operated to feed the developing solution 5 passed through the brush 42 to the exposed printing raw plate. An unexposed portion of the photosensitive resin composition and infrared ablation layer in the exposed printing raw plate were dissolved in the developing solution 5. The developing solution 5 comprising the dispersing photosensitive resin composition, the flocculated photosensitive resin composition, and the infrared ablation layer was returned to the developing solution tank 21.

The developing solution 5 comprising the dispersing photosensitive resin composition, the flocculated photosensitive resin composition, and the infrared ablation layer was fed to the dispersing-object-filter 13 through the feeder 32, and the dispersing photosensitive resin composition began to be flocculated by the dispersing-object-filter.

(4) The entire unexposed portion of the exposed printing raw plate was developed, and preparing of the printing plate was completed. Then, the printing plate was dismounted from the stage 41. The next exposed printing raw plate obtained in the manner in Production Example 1 was mounted on the stage 41, and the exposed printing raw plate was developed. Development of the exposed printing raw plate was repeated. When three exposed printing raw plates were developed, the interlock of the pressure filtration apparatus (it stops when the pressure $P_1$ on the internal surface side of the dispersing-object-filter reaches not less than 0.3 MPa) was operated, and development was completed.

The time needed to develop one exposed printing raw plate was 0.5 hours on average.

Example 4

The exposed printing raw plate was developed in the same manner as in Example 3 except that a polypropylene filter "R-10-PP-12-ES" (trademark) made by Kajika Corporation (thickness of 2.3 mm, density of 0.147 g/cm$^3$) with a degree of filtration of 10 μm was used as the dispersing-object-filter. Then, the interlock of the pressure filtration apparatus was operated when six exposed printing raw plates were developed, and development was completed.

Example 5

The exposed printing raw plate was developed in the same manner as in Example 3 except that a polypropylene filter "R-25-PP-12-ES" (trademark) made by Kajika Corporation (thickness of 2.2 mm, density of 0.137 g/cm³) with a degree of filtration of 25 μm was used as the dispersing-object-filter. Then, the interlock of the pressure filtration apparatus was operated when seven exposed printing raw plates were developed, and development was completed.

Example 6

The exposed printing raw plate was developed in the same manner as in Example 3 except that a polypropylene filter "R-100-PP-12-ES" (trademark) made by Kajika Corporation (thickness of 1.7 mm, density of 0.184 g/cm³) with a degree of filtration of 100 μm was used as the dispersing-object-filter. Then, the interlock of the pressure filtration apparatus was operated when eleven exposed printing raw plates were developed, and development was completed.

Figure 18:
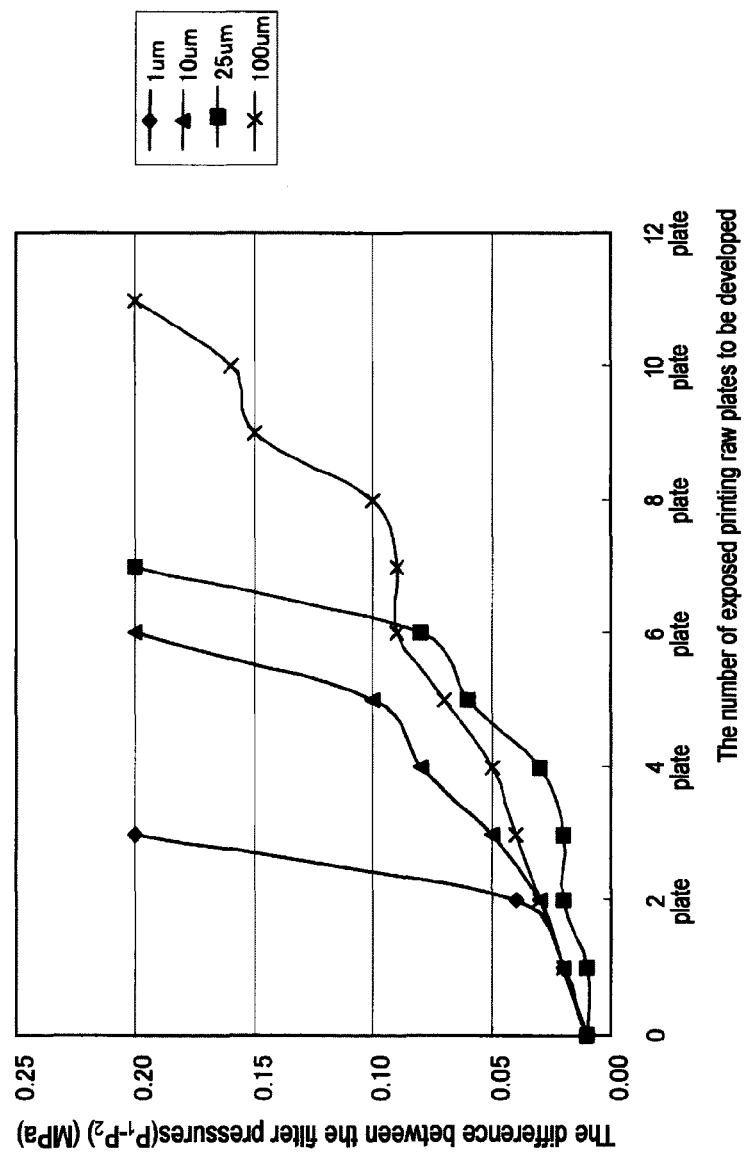
FIG. 18 is a graph showing a relationship between the number of exposed printing raw plates to be developed and the difference between the filter pressures according to Examples 3 to 6.

FIG. 18 shows the relationship between the number of the exposed printing raw plates developed and the difference between the filter pressures according to Examples 3 to 6. In FIG. 18, the values in the portion surrounded by a square show the filtration accuracies of the dispersing-object-filters used in Examples 3 to 6.

Example 7

Figure 7:
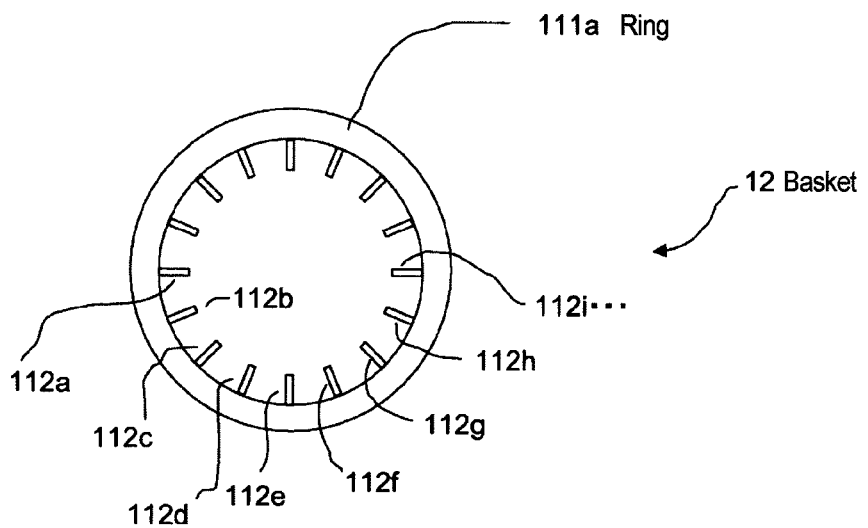
FIG. 7 is a top view showing the basket according to the third embodiment.
Figure 19:
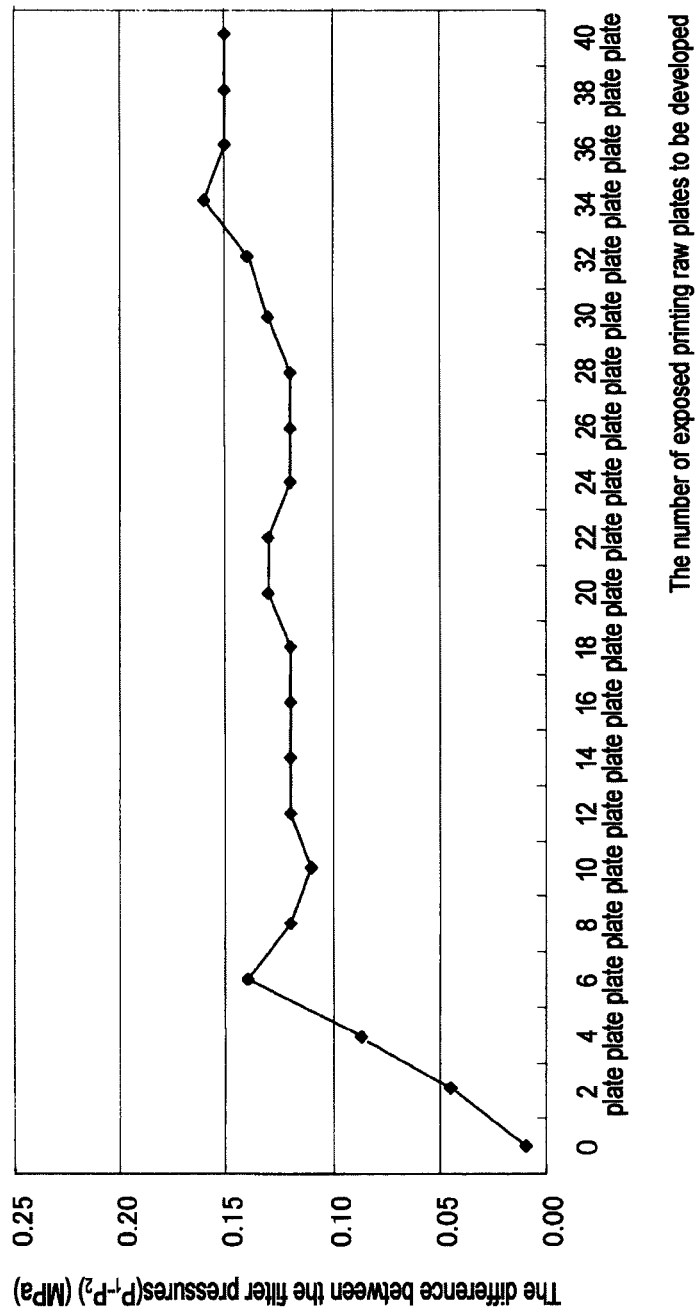
FIG. 19 is a graph showing a relationship between the number of exposed printing raw plates to be developed and the difference between the filter pressures according to Example 7.

The exposed printing raw plate was developed in the same manner as in Example 4 except that the basket described in the third embodiment and having the plurality of spacers and the plurality of rings was used for the pressure filtration apparatus. Then, as shown in FIG. 19, the difference between the filter pressures was equilibrating at 0.14 MPa at maximum until the number of the exposed printing raw plate developed reached 30 sheets, even if the exposed printing raw plate was continuously developed. Thirty or more exposed printing raw plates could be developed. Accordingly, it was shown that the exposed printing raw plate can be continuously developed by use of the basket as shown in FIGS. 6 and 7. The flocculate formed by the dispersing-object-filter could be suitably recovered by the flocculating-object-filter.

Each width of the plurality of spacers was 15 mm, and the interval D between the plurality of spacers was 12 mm in the inside of the space that contacted the dispersing-object-filter.

Example 8

In the case where the dispersing-object-filter used in Example 1 was replaced by the filters shown in Table 1, the photosensitive resin composition dispersing in the aqueous developing solution was flocculated suitably, and could be recovered by the flocculating-object-filter.

TABLE 1

|  | Characteristics of filter | | | |
| --- | --- | --- | --- | --- |
|  | Degree of filtration | Thickness central value (load of 1 kg) | Density g/cm³ | Flocculation of resin component |
| Made by Kajika Corporation | 1 um | 2.4 mm | 0.174 | Possible |
|  | 5 um | 2.2 mm | 0.159 | Possible |
|  | 10 um | 2.3 mm | 0.147 | Possible |
|  | 25 um | 2.2 mm | 0.137 | Possible |
|  | 50 um | 2.5 mm | 0.122 | Possible |
|  | 100 um | 1.7 mm | 0.184 | Possible |
|  | 200 um | 1.6 mm | 0.174 | Possible |

TABLE 1-continued

|  | Characteristics of filter | | | |
| --- | --- | --- | --- | --- |
|  | Degree of filtration | Thickness central value (load of 1 kg) | Density g/cm³ | Flocculation of resin component |
| Made by Mitaka | 10-20 um | 0.36 mm | 0.304 | Possible |
|  | 20-40 um | 0.17 mm | 0.419 | Possible |
|  | 50-100 um | 0.20 mm | 0.446 | Possible |

Comparative Example 1

The exposed printing raw plate was developed in the same manner as in Example 3 except that the lid 14 was removed so that both of the spaces on the internal surface side and the external surface side of the dispersing-object-filter had the atmospheric pressure, and continuous platemaking performance was evaluated. Then, the dispersing-object-filter was clogged when one exposed printing raw plate was developed, and the amount of the developing solution coming out from the dispersing-object-filter was extremely reduced. Accordingly, development was completed.

Comparative Example 2

The exposed printing raw plate was developed in the same manner as in Example 4 except that the lid 14 was removed so that both of the spaces on the internal surface side and the external surface side of the dispersing-object-filter had the atmospheric pressure. Then, the dispersing-object-filter was clogged when two exposed printing raw plates were developed, and the amount of the developing solution coming out from the dispersing-object-filter was extremely reduced. Accordingly, development was completed.

Comparative Example 3

The exposed printing raw plate was developed in the same manner as in Example 5 except that the lid 14 was removed so that both of the spaces on the internal surface side and the external surface side of the dispersing-object-filter had the atmospheric pressure. Then, the dispersing-object-filter was clogged when three exposed printing raw plates were developed, and the amount of the developing solution coming out from the dispersing-object-filter was extremely reduced. Accordingly, development was completed.

Comparative Example 4

The exposed printing raw plate was developed in the same manner as in Example 6 except that the lid 14 was removed so that both of the spaces on the internal surface side and the external surface side of the dispersing-object-filter had the atmospheric pressure. Then, the dispersing-object-filter was clogged when five exposed printing raw plates were developed, and the amount of the developing solution coming out from the dispersing-object-filter was extremely reduced. Accordingly, development was completed.

The following experiments were performed using a developer comprising a settling tank.

Production Example 2

A printing raw plate "DEF-20" (trademark) made by Asahi Kasei E-materials Corp. was prepared, the printing raw plate being prepared by laminating a support made of PET, a photosensitive resin composition layer, and an infrared laser ablation layer in this order, and formed into a sheet form measuring 900 mm long, 1067 mm wide, and 1.14 mm thick.

The printing raw plate was exposed from the support side using an ultraviolet-rays exposure machine made by Asahi Kasei E-materials Corp. "AFP-912EDLF" (trademark) such that the thickness of a cured layer comprising the thickness of the support of the printing raw plate might be 0.54 mm. Next, a pattern at an image area rate of 30% was drawn in the infrared ablation layer using a laser drawing machine "CDI SPARK 4260" (trademark) made by ESKO ARTWORKS.

Next, the printing raw plate was exposed for 7 minutes from the infrared ablation layer side by the exposure machine to obtain an exposed printing raw plate.

Example 9

Performance of treatment of the developing solution was evaluated using the developer described in the fifth embodiment.
<Description of Apparatus Used>
A pressure filtration apparatus comprising the basket 7, the housing 11, the lid 14, the fixing ring 16, the feeder 32 and the settling tank 71, "Kasupon filter MCF-0420TS" (trademark) made by Mitaka, Co., Ltd. and provided with the flocculation filter 15 and the settling tank 71, was used. The lid 14 was closed.

As the dispersing-object-filter 13 attached to the pressure filtration apparatus, a polypropylene filter "R-1-PP-12-ES" (trademark) (thickness of 2.4 mm, density of 0.174 g/cm$^3$) made by Kajika Corporation was used.

As the flocculating-object-filter 15, a nylon mesh (opening of 0.3 mm) was used.

As the developer comprising the stage 41, the brush 42, and the developing layer 43, an aqueous development printing developing machine "AWP-220W" (trademark) made by Asahi Kasei E-materials Corp. was used.

As the developing solution 5, 250 lit. of a fresh developing solution was prepared in the developing solution tank 21, the developing solution being prepared by diluting "W300" (trademark) made by Asahi Kasei E-materials Corp. by water such that the concentration might be 6 wt %, and comprising 0.4 wt % of sodium carbonate. 200 lit. of the developing solution 5 was prepared in the developing solution tank 120. The developing solution 5 was heated to 40° C.
<Steps>
(1) The feeder 32 was operated to sequentially circulate the fresh developing solution 5 from the developing solution tank 21 through dispersing-object-filter 13 to the flocculating-object-filter 15.
(2) The feeder 31 was operated to feed the developing solution 5 passed through the brush 42 to an unexposed printing raw plate "DEF-20" (trademark) made by Asahi Kasei E-materials Corp. and mounted on the stage 41. The photosensitive resin composition and infrared ablation layer of the printing raw plate were developed by the developing solution 5. The developing solution 5 comprising the dispersing photosensitive resin composition, the flocculated photosensitive resin composition, and the infrared ablation layer was returned to the developing solution tank 21.

The developing solution 5 comprising the dispersing photosensitive resin composition, the flocculated photosensitive resin composition, and the infrared ablation layer was fed to the dispersing-object-filter 13 through the feeder 32, and the dispersing photosensitive resin composition began to be flocculated by the dispersing-object-filter. After the photosensitive resin composition layer and infrared ablation layer of the printing raw plate were all removed, the printing raw plate was dismounted from the stage 41. Another non-exposed printing raw plate "DEF-20" (trademark) was mounted on the stage 41, and the developing solution 5 was fed to the non-exposed printing raw plate to develop the photosensitive resin composition layer and the infrared ablation layer by the developing solution 5. This procedure was repeated to develop thirty-two non-exposed printing raw plates in total.

The developing solution in the settling tank was fed to the rinse brush 51 using the feeder 33 for washing of each printing raw plate. Subsequently, the developing solution 5 passed through the flocculating-object-filter 15 was fed to the settling tank 71 for 40 seconds using the feeder 33. The developing solution 5 excessively fed to the settling tank 71 was overflowed to be returned to the developing solution tank 120, and circulated.

(3) When 3.5 hours had passed since the feeder 31 was operated, the flocculated photosensitive resin composition component began to be pushed out from the dispersing-object-filter 13, and caught by the flocculating-object-filter 15. It took 12 hours until the photosensitive resin composition layers and infrared ablation layers of the thirty-two printing raw plates all were dissolved in the developing solution. During this period, while water lost by vaporization was replenished for washing of each printing raw plate to keep the water level in the apparatus constant, the "W300" (trademark) and sodium carbonate were not additionally fed. The total of the mass of the developed photosensitive resin composition layer and that of the infrared ablation layer was 27 kg. The mass obtained by subtracting the mass of the photopolymerizable unsaturated monomer component and that of the photopolymerization initiator component from the total mass was 22 kg.
(4) The feeder 31 and the feeder 32 were further operated for 3 hours after the photosensitive resin composition layer and infrared ablation layer of the printing raw plate 1 were all dissolved in the developing solution. Subsequently, the feeder 31 and the feeder 32 were stopped. The developing solution of the settling tank 71 was settled for 24 hours. Then, 100 L of the developing solution was separated into 40 L of the high concentration layer and 60 L of the low concentration layer. At this time, using a Zahn cup #3, the viscosity at 40° C. of the high concentration layer was 18 seconds, and that of the low concentration layer was 10 seconds.
(5) The low concentration layer was fed to the rinse brush 51, and washing was performed. The low concentration layer was magnified 10 times by a magnifier to count the number of the deposit originating in the dispersing objects adhering to the printing plate. The number of dispersing objects was not more than 20 per printing plate.
(6) 20 ml of the developing solution before settling, 20 ml of the low concentration layer, and 20 ml of the high concentration layer were extracted, and dried at 50° C. for 24 hours. The mass obtained by subtracting the mass of the component of the developing solution from the mass of each of the thus-obtained product was calculated, and the concentration of the photosensitive resin composition included in the developing solution before settling, that in the low concentration layer, and that in the high concentration layer were calculated.

The concentration of the photosensitive resin composition included in the developing solution before settling was 28 g/L, that of the photosensitive resin composition in the low concentration layer after settling was 6 g/L, and that of the photosensitive resin composition in the high concentration layer was 60 g/L.

Example 10

(1) Continuous platemaking was performed in the same manner as in Example 9 except that the temperature of the developing solution was increased to 45° C.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 8 hours. Then, 100 L of the developing solution was separated into 40 L of the high concentration layer and 60 L of the low concentration layer.
(3) The low concentration layer was fed to the rinse brush 51, and washing was performed. The low concentration layer was magnified 10 times by a magnifier to count the number of the deposit originating in the dispersing objects adhering to the printing plate. The number of dispersing objects was not more than 20 per printing plate.

Example 11

(1) Continuous platemaking was performed in the same manner as in Example 9 except that sodium carbonate was added at 0.8 wt %.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 12 hours. Then, 100 L of the developing solution was separated into 40 L of the high concentration layer and 60 L of the low concentration layer.
(3) The low concentration layer was fed to the rinse brush 51, and washing was performed. The low concentration layer was magnified 10 times by a magnifier to count the number of the deposit originating in the dispersing objects adhering to the printing plate. The number of dispersing objects was not more than 20 per printing plate.

Example 12

(1) Continuous platemaking was performed in the same manner as in Example 9 except that the temperature of the developing solution was increased to 45° C., and the concentration of sodium carbonate was 0.8 wt %.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 3 hours. Then, 100 L of the developing solution was separated into 40 L of the high concentration layer and 60 L of the low concentration layer.
(3) The low concentration layer was fed to the rinse brush 51, and washing was performed. The low concentration layer was magnified 10 times by a magnifier to count the number of the deposit originating in the dispersing objects adhering to the printing plate. The number of dispersing objects was not more than 20 per printing plate.

Comparative Example 5

(1) Continuous platemaking was performed in the same manner as in Example 9 except that no dispersing-object-filter and no flocculating-object-filter were attached.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 24 hours. Then, the developing solution was not separated into the high concentration layer and the low concentration layer.
(3) The low concentration layer was fed to the rinse brush 51, and washing was performed. The low concentration layer was magnified 10 times by a magnifier to count the number of the deposit originating in the dispersing objects adhering to the printing plate. The number of dispersing objects was not less than 100 per printing plate.

Comparative Example 6

(1) The exposed printing raw plate was developed in the same manner as in Example 9 except that the lid 14 was removed so that both of the spaces on the internal surface side and the external surface side of the dispersing-object-filter had the atmospheric pressure. Continuous platemaking performance was evaluated.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 24 hours. Then, the developing solution was not separated into the high concentration layer and the low concentration layer.
(3) The low concentration layer was fed to the rinse brush 51, and washing was performed. The low concentration layer was magnified 10 times by a magnifier to count the number of dispersing objects adhering to the printing plate. The number of the deposit originating in the dispersing objects was not less than 100 per printing plate.

Comparative Example 7

(1) Continuous platemaking was performed in the same manner as in Example 9 except that no dispersing-object-filter and no flocculating-object-filter were attached, and the temperature of the developing solution was increased to 45° C.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution in the settling tank 71 was settled for 24 hours. Based on an amount of 100 of the developing solution, 80 percent of the high concentration layer and 20 percent of the low concentration layer were merely separated.

Comparative Example 8

(1) Continuous platemaking was performed in the same manner as in Example 9 except that no dispersing-object-filter and no flocculating-object-filter were attached, and the concentration of sodium carbonate was 0.8 wt %.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. The developing solution of the settling tank 71 was settled for 24 hours. Then, the developing solution was not separated into the high concentration layer and the low concentration layer.

Comparative Example 9

(1) Continuous platemaking was performed in the same manner as in Example 1 except that no dispersing-object-filter and no flocculating-object-filter were attached, the temperature of the developing solution was increased to 45° C., and the concentration of sodium carbonate was 0.8 wt %.
(2) The feeder 31 and the feeder 32 were further operated for 3 hours after the photosensitive resin composition layer and infrared ablation layer of the printing raw plate 1 all were dissolved in the developing solution. Subsequently, the feeder 31 and the feeder 32 were stopped. 100 L of the developing solution in the settling tank 71 was settled for 12 hours. 80 percent of the high concentration layer and 20 percent of the low concentration layer were merely separated.

TABLE 2

| | Flocculating-object-filter | Dispersing-object-filter | Pressurization | Developing solution temperature | $Na_2CO_3$ concentration | Separation time | High concentration layer:low concentration layer | Adhering object |
|---|---|---|---|---|---|---|---|---|
| Example 1 | ○ | ○ | ○ | 40° C. | 0.4 wt % | 24 hours | 4:6 | Not more than 20 |
| Example 2 | ○ | ○ | ○ | 45° C. | 0.4 wt % | 8 hours | 4:6 | Not more than 20 |
| Example 3 | ○ | ○ | ○ | 40° C. | 0.8 wt % | 12 hours | 4:6 | Not more than 20 |
| Example 4 | ○ | ○ | ○ | 45° C. | 0.8 wt % | 3 hours | 4:6 | Not more than 20 |
| Comparative Example 1 | X | X | X | 40° C. | 0.4 wt % | Not separated | | Not less than 100 |
| Comparative Example 2 | ○ | ○ | X | 40° C. | 0.4 wt % | Not separated | | Not less than 100 |
| Comparative Example 3 | X | X | X | 45° C. | 0.4 wt % | 24 hours | 8:2 | Not less than 100 |
| Comparative Example 4 | X | X | X | 40° C. | 0.8 wt % | Not separated | | Not less than 100 |
| Comparative Example 5 | X | X | X | 45° C. | 0.8 wt % | 12 hours | 8:2 | Not less than 100 |

Other Embodiments

The present invention has been described according to the embodiments above, but it should not be understood that the description and drawings which are part of this disclosure limit the present invention. From this disclosure, various alternative embodiments, Examples, and techniques to carry out those should be obvious to the persons skilled in the art. For example, in the developer shown in FIG. 1, the developing solution 5 passed through the dispersing-object-filter 13 may pass through the dispersing-object-filter 13 again to further reduce the amount of the photosensitive resin composition in the developing solution 5. Alternatively, the developing solution 5 passed through the flocculating-object-filter 15 may pass through the dispersing-object-filter 13 and the flocculating-object-filter 15 again, and then, be returned to the developing solution tank 21. Because the developing solution 5 passed through the flocculating-object-filter 15 does not comprise the flocculate 62, clogging of the dispersing-object-filter 13 can be prevented, and purity of the developing solution 5 can be further improved. Alternatively, the developing solution 5 passed through the flocculating-object-filter 15 may pass through the dispersing-object-filter 13 and the flocculating-object-filter 15 again, and then, be sent to the settling tank 71. Because the low concentration layer 82 that passes through the flocculating-object-filter 15 and is settled by the settling tank 71 does not comprise the flocculate 62 and the high concentration layer 81, clogging of the dispersing-object-filter 13 can be prevented, and purity of the developing solution 5 can be further improved. Thus, it should be understood that the present invention includes various embodiments which have not been described here.

CROSS-REFERENCE OF RELATED APPLICATIONS

The present application is based on Japanese Patent Application No. 2009-107051, filed on Apr. 24, 2009 to Japan Patent Office, and Japanese Patent Application No. 2010-100379, filed on Apr. 23, 2010 to Japan Patent Office, the subjects of which are incorporated herein by reference.

INDUSTRIAL APPLICABILITY

The developer and filter apparatus according to the present invention can be used for chemical industry, printing industry, semiconductor industry, and the like.

| Reference Signs List | |
|---|---|
| 1 | (Exposed) printing Raw Plate |
| 5 | Developing Solution |
| 11 | Housing |
| 12 | Basket |
| 13 | Dispersing-Object-Filter |
| 15 | Flocculating-Object-Filter |
| 16 | Fixing Ring |
| 21 | Developing Solution Tank |
| 31, 32, 33 | Feeders |
| 41 | Stage |
| 42 | Brush |
| 43 | Developing Tank |
| 51, 52 | Rinse Brushes |
| 53 | Washing Brush |
| 71 | Settling Tank |
| 81 | High Concentration Layer |
| 82 | Low Concentration Layer |
| 111a, 111b, 111c, 111d, 111e, 111f | Rings |

-continued

Reference Signs List

| | |
|---|---|
| 112a, 112b, 112c, 112d, 112e, 112f, 112g, 112h, 112i ... | Spacers |

The invention claimed is:

1. A process for producing a printing plate, comprising:
feeding a developing solution to an exposed photosensitive resin composition layer;
passing the developing solution, in which a photosensitive resin composition is dispersed, through a dispersed-material-filter and flocculating the photosensitive resin composition dispersed in the developing solution by passage through the dispersed-material-filter; and
removing a flocculated photosensitive resin composition from the developing solution passed through the dispersed-material-filter.

2. The process for producing a printing plate according to claim 1, further comprising:
feeding a developing solution comprising the developing solution from which a flocculate is removed to the exposed photosensitive resin composition layer.

3. The process for producing a printing plate according to claim 1, wherein the flocculating of the photosensitive resin composition is comprises increasing pressure in a feed side space of the dispersed-material-filter and/or reducing pressure in a discharge side space of the dispersed-material-filter.

4. The process for producing a printing plate according to claim 3, wherein the feed side space of the dispersed-material-filter is an internal surface side space of the dispersed-material-filter, and the discharge side space of the dispersed-material-filter is an external surface side space of the dispersed-material-filter.

5. The process for producing a printing plate according to claim 1, wherein a pressure P1 in the feed side space of the dispersed-material-filter and a pressure P2 in the discharge side space of the dispersed-material-filter satisfy a following formula:

$$0.02\ \text{MPa} < P1 - P2 < 2\ \text{MPa}.$$

6. The process for producing a printing plate according to claim 1, wherein the photosensitive resin composition comprises a hydrophilic polymer.

7. The process for producing a printing plate according to claim 1, further comprising:
settling the developing solution from which the flocculated photosensitive resin composition is removed in a settling tank, so as to separate the developing solution into a high concentration layer and a low concentration layer.

8. The process for producing a printing plate according to claim 7, further comprising:
extracting the high concentration layer from the settling tank.

9. The process for producing a printing plate according to claim 7, further comprising:
feeding the low concentration layer to a rinse brush.

10. The process for producing a printing plate according to claim 7, comprising:
making a temperature of the developing solution in the settling tank higher than a temperature of the developing solution in a washer tank.

11. A filter apparatus, comprising:
a dispersed-material-filter, wherein a solution in which a resin composition is dispersed, is passed through the dispersed-material-filter to flocculate the resin composition dispersed in the solution; and
a flocculated-material-filter that removes a flocculated resin composition from the solution passed through the dispersed-material-filter.

12. The filter apparatus according to claim 11, further comprising a device that increases pressure in a feed side space of the dispersed-material-filter and/or a device that reduces pressure in a discharge side space of the dispersed-material-filter.

13. The filter apparatus according to claim 12, wherein the feed side space of the dispersed-material-filter is an internal surface side space of the dispersed-material-filter, and the discharge side space of the dispersed-material-filter is an external surface side space of the dispersed-material-filter.

14. The filter apparatus according to claim 11, further comprising a basket in an outer side space surface of the dispersed-material-filter.

15. The filter apparatus according to claim 11, wherein the dispersed-material-filter is a bag filter.

16. The filter apparatus according to claim 11, wherein the dispersed-material-filter is a mesh filter of metal.

17. The filter apparatus according to claim 11, further comprising a settling tank for the developing solution passed through the flocculated-material-filter.

18. The filter apparatus according to claim 17, further comprising an exit for extracting a high concentration layer from the settling tank.

19. The filter apparatus according to claim 17, wherein the settling tank comprises a temperature regulation mechanism that heats the developing solution.

* * * * *

UNITED STATES PATENT AND TRADEMARK OFFICE
CERTIFICATE OF CORRECTION

| | | |
|---|---|---|
| PATENT NO. | : 8,714,845 B2 | Page 1 of 1 |
| APPLICATION NO. | : 13/865334 | |
| DATED | : May 6, 2014 | |
| INVENTOR(S) | : K. Suzuki et al. | |

It is certified that error appears in the above-identified patent and that said Letters Patent is hereby corrected as shown below:

On the Title Page, Item (63)/Related U.S. Application Data, please change "13/365,659" to -- 13/265,659 --.

Signed and Sealed this
Twenty-third Day of September, 2014

Michelle K. Lee
*Deputy Director of the United States Patent and Trademark Office*